United States Patent
Shiraishi

(10) Patent No.: US 7,359,474 B2
(45) Date of Patent: Apr. 15, 2008

(54) CLOCK RECOVERY CIRCUIT AND CLOCK-RECOVERING FILTER CIRCUIT

(75) Inventor: Mikio Shiraishi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 645 days.

(21) Appl. No.: 10/912,654

(22) Filed: Aug. 4, 2004

(65) Prior Publication Data

US 2005/0036579 A1 Feb. 17, 2005

(30) Foreign Application Priority Data

Aug. 8, 2003 (JP) ............................. 2003-290663

(51) Int. Cl.
*H03D 3/24* (2006.01)
*H04N 7/04* (2006.01)
(52) U.S. Cl. ...................... 375/375; 348/470
(58) Field of Classification Search ................ 375/375, 375/376, 350, 256, 326; 370/321, 347; 348/470, 348/608
See application file for complete search history.

(56) References Cited

U.S. PATENT DOCUMENTS

| | | | |
|---|---|---|---|
| 5,944,771 A | 8/1999 | Shiraishi | |
| 5,957,996 A | 9/1999 | Shiraishi | |
| 6,137,332 A | 10/2000 | Inoue et al. | |
| 6,269,125 B1 * | 7/2001 | Seccia et al. | ............... 375/265 |
| 6,570,419 B2 | 5/2003 | Hanzawa et al. | |
| 2005/0036579 A1 * | 2/2005 | Shiraishi | ..................... 375/375 |

FOREIGN PATENT DOCUMENTS

JP 4-127737 4/1992

* cited by examiner

*Primary Examiner*—Khai Tran
(74) *Attorney, Agent, or Firm*—DLA Piper US LLP

(57) ABSTRACT

There is provided a clock-recovering filter circuit for use in a clock recovery circuit that generates a recovery clock signal from input data from an external device and a reference clock signal. The filter circuit includes: a pulse-inserting circuit which inserts pulses in a first phase-advancing signal or a first phase-delaying signal, thereby generating a second phase-advancing signal or a second phase-delaying signal; and a frequency-offset detecting circuit which detects frequency-offset data from the second phase-advancing signal and the second phase-delaying signal, the frequency-offset data representing a frequency difference between the recovery clock signal and the reference clock signal. The pulse-inserting circuit inserts pulses in accordance with the frequency-offset data when the first phase-advancing signal or the first phase-delaying signal is not input.

13 Claims, 16 Drawing Sheets

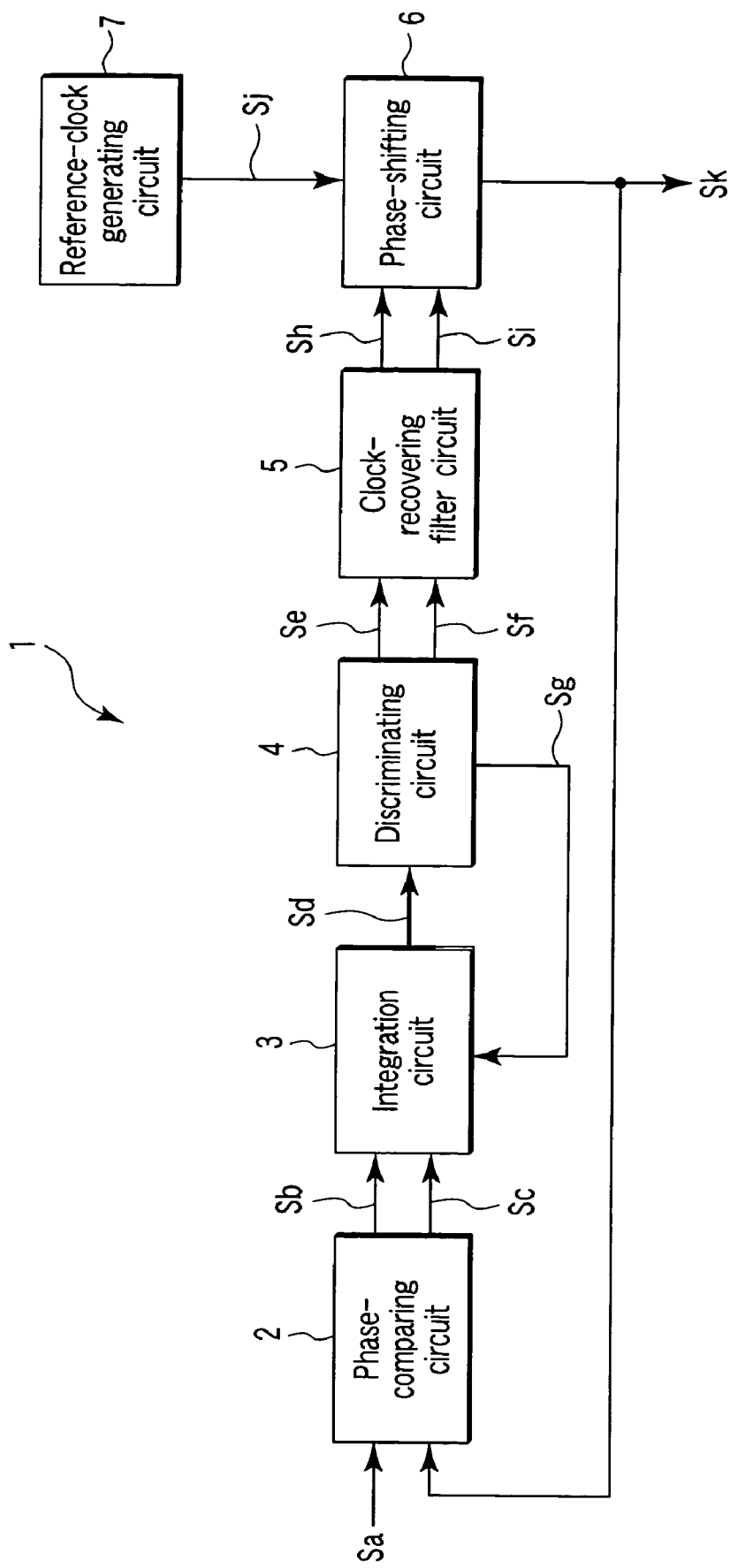
F I G. 1

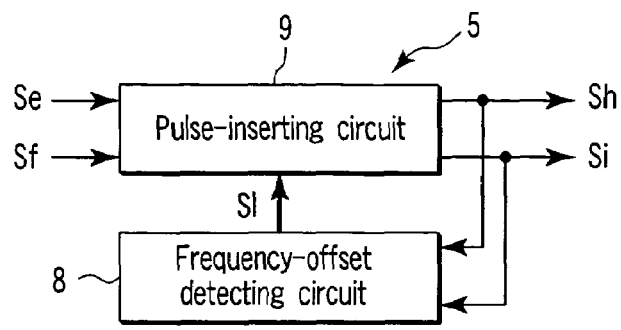
FIG. 6
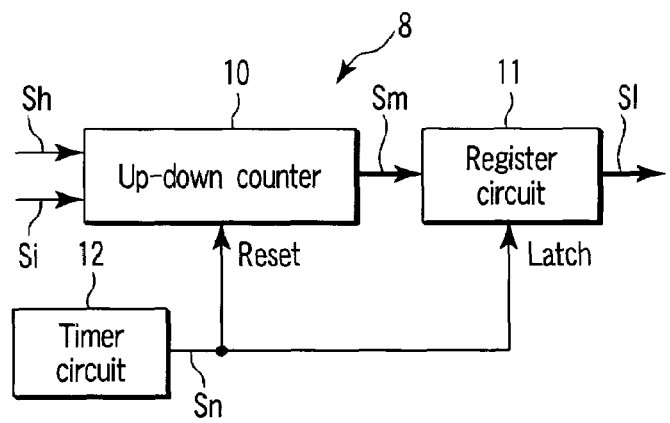
FIG. 7
| SI | Count | Polarity |
|-----|-------|----------|
| 000 | 0 | |
| 001 | 1 | |
| 010 | 2 | + |
| 011 | 3 | |
| 100 | -4 | |
| 101 | -3 | |
| 110 | -2 | - |
| 111 | -1 | |
FIG. 8

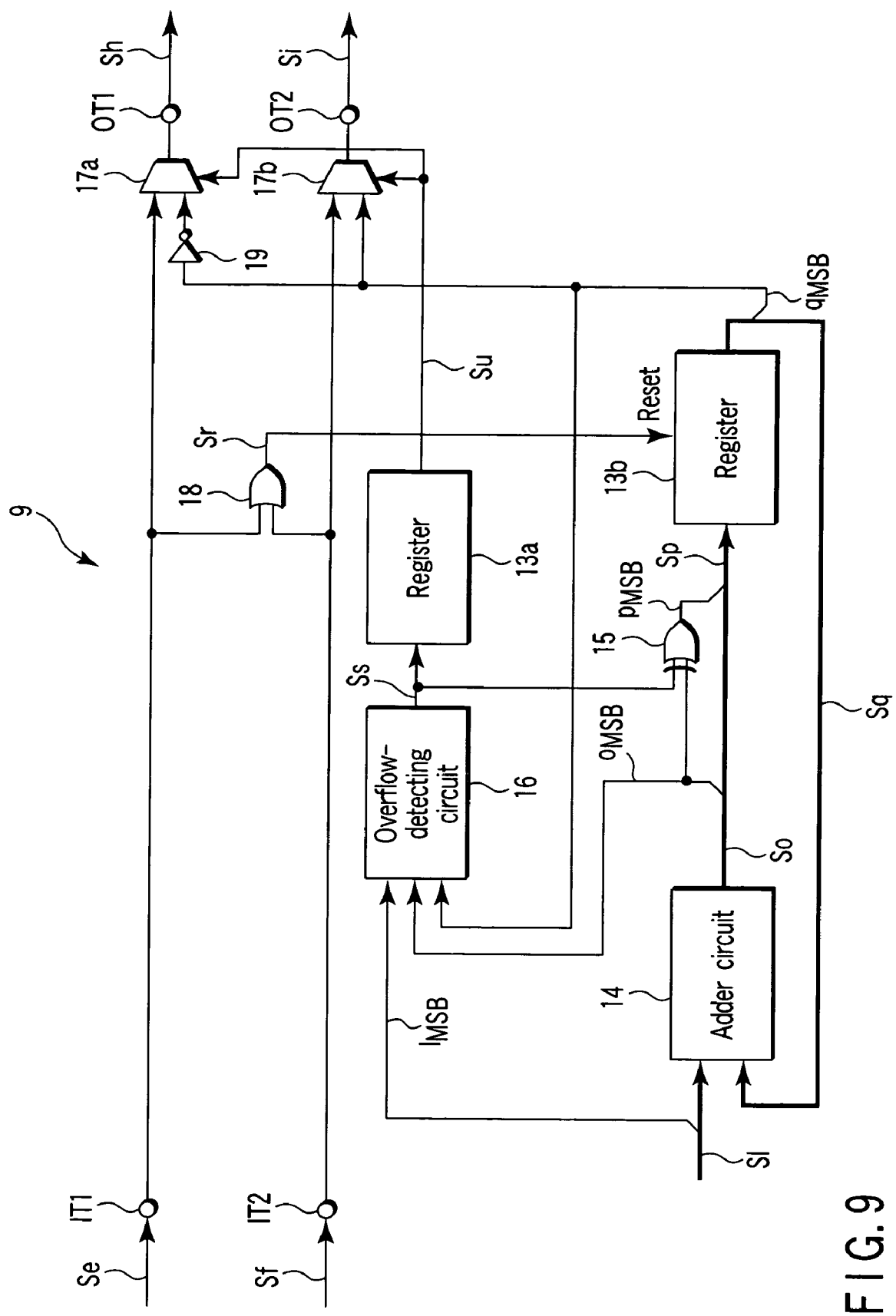
F I G. 9

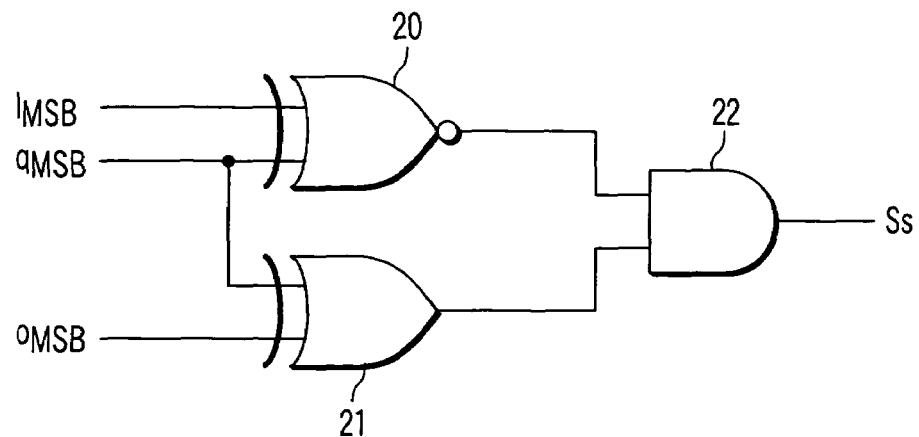
F I G. 10
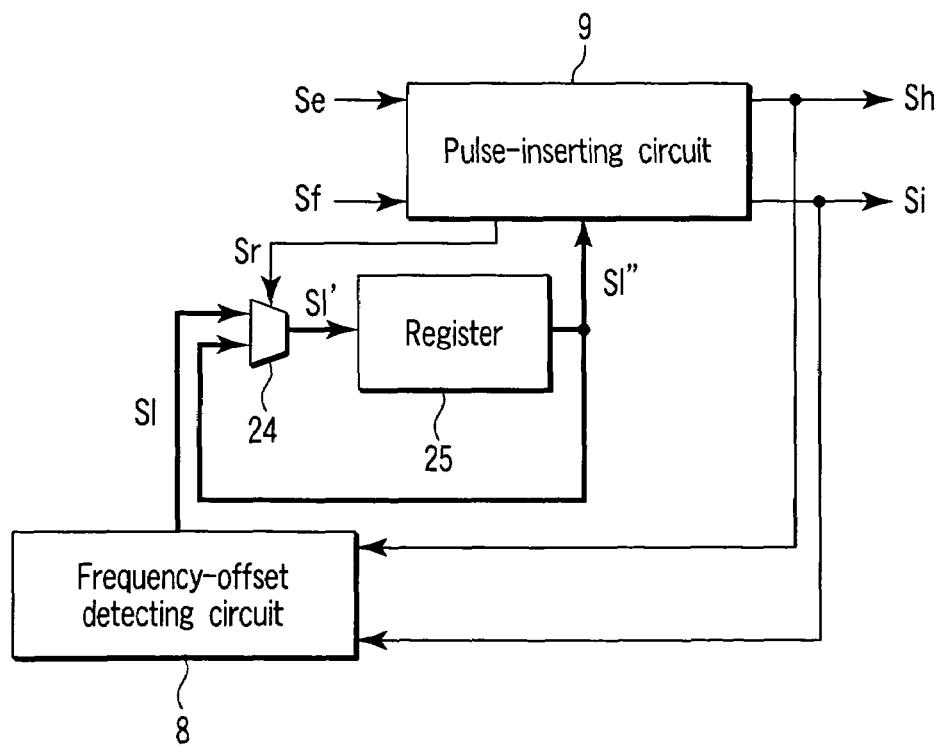
F I G. 11

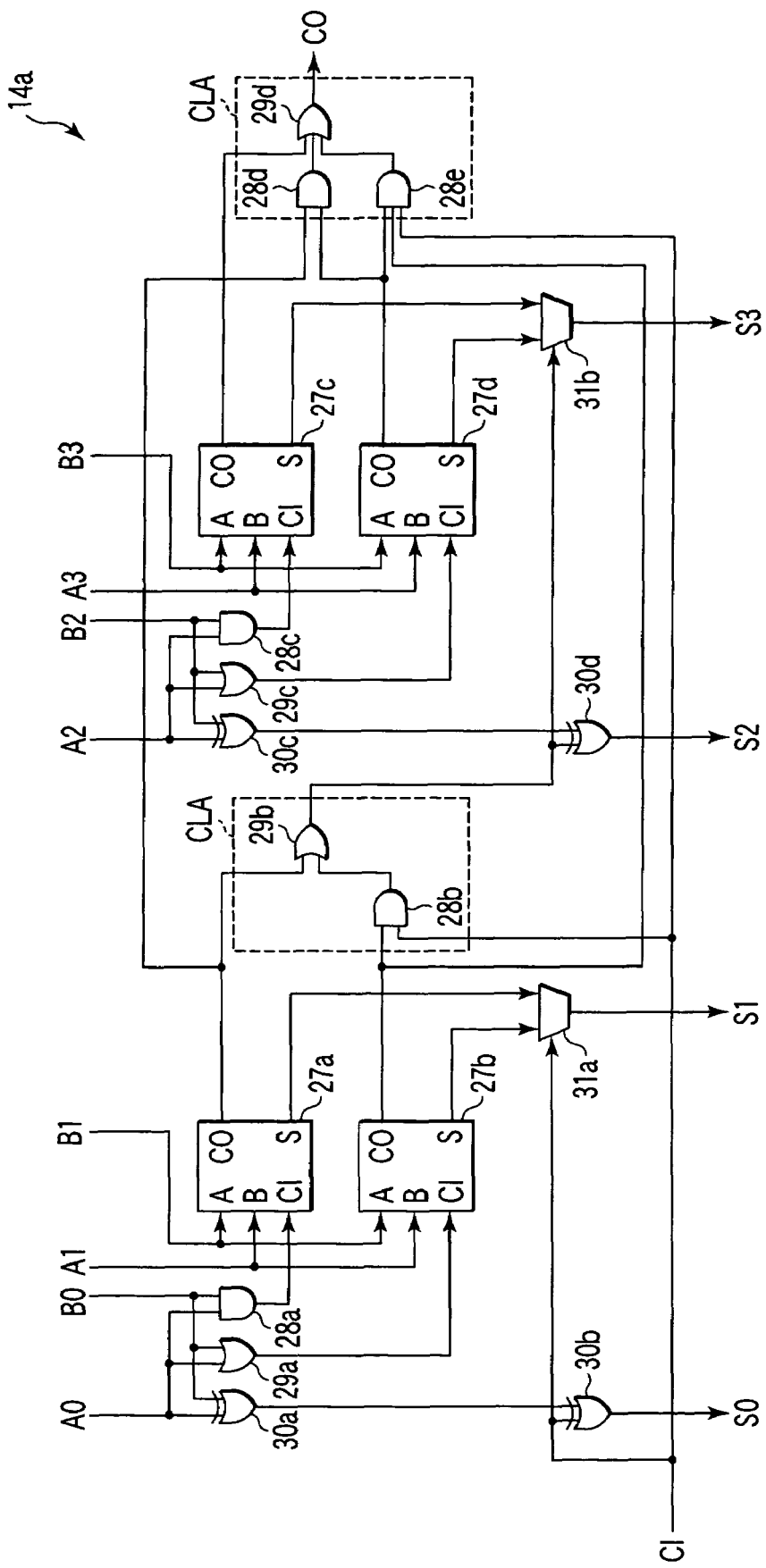
F I G. 14

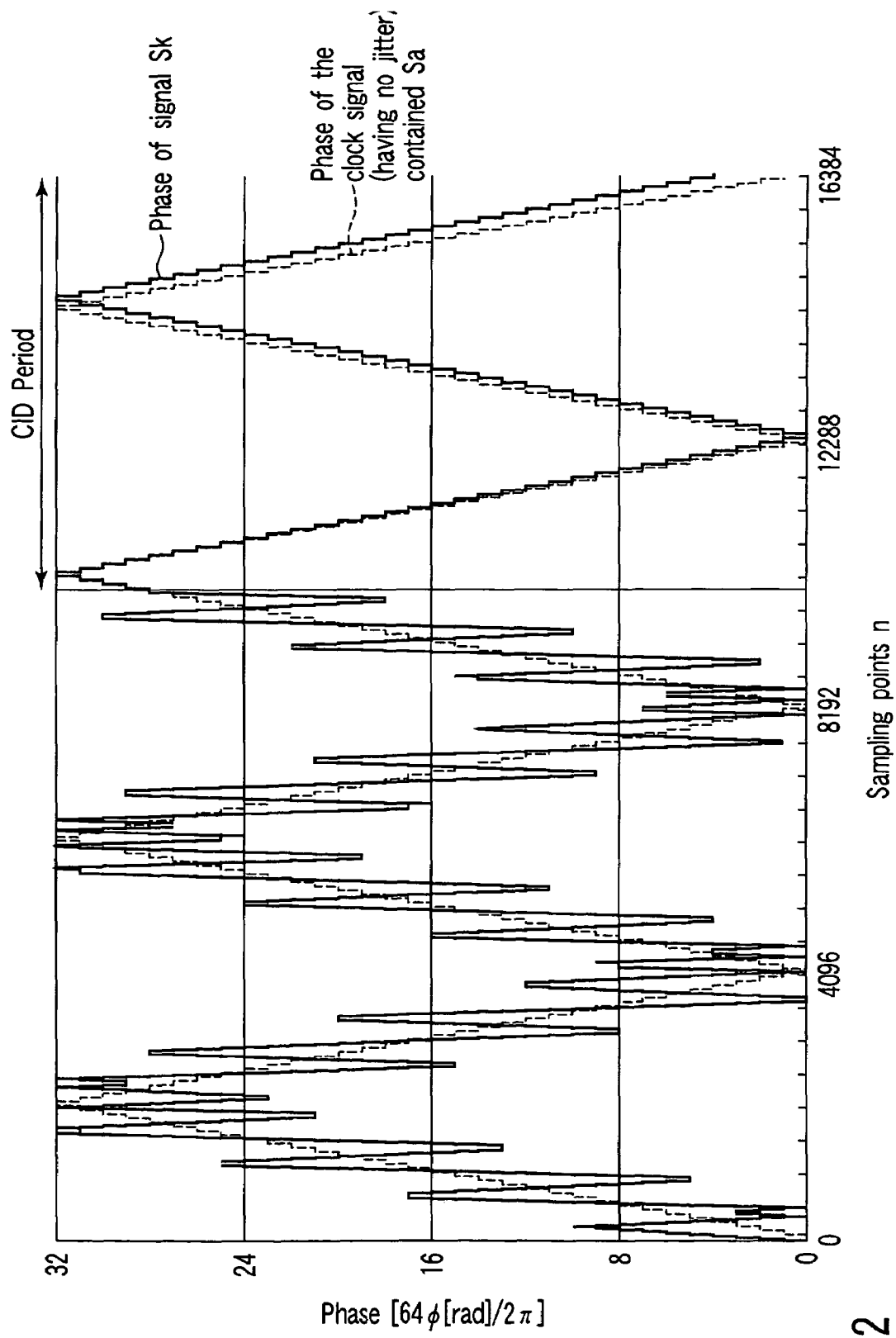
F I G. 22

CLOCK RECOVERY CIRCUIT AND CLOCK-RECOVERING FILTER CIRCUIT

CROSS-REFERENCE TO RELATED APPLICATIONS

This application is based upon and claims the benefit of priority from prior Japanese Patent Application No. 2003-290663, filed Aug. 8, 2003, the entire contents of which are incorporated herein by reference.

BACKGROUND OF THE INVENTION

1. Field of the Invention

The present invention relates to a clock recovery circuit for recovering a clock signal from a change in the data transmitted from a device.

2. Description of the Related Art

When data is transmitted at such a high speed as 1 gigabits/sec, pulses are delayed or reflected and signal pulses interfere with reflected pulses. The delay or reflection of pulses and the interference of pulses result from the characteristics of the receiving and transmitting circuits used or from the characteristics of the transmission path connected to the transmitting and receiving devices and including connectors. Inevitably, a skew develops between the time the data arrives and the time the clock signal arrives, in the receiving device. The skew makes it difficult to determine the contents of the data received in the receiving device. To determine the contents of the data, the technique called "clock data recovery (CDR)" is employed. In CDR, the transmitting device does not transmit a clock signal, and the receiving device recovers the clock signal from a high-to-low or low-to-high level transition of the data received.

In the CDR, the receiving device cannot recover the clock signal if no level transition has occurred in the data received. To cause a level transition in the data, the communications standard that puts importance on reliable data transmission describes that the transmitting device should encode the byte data into 10-bit codes, each containing at least one high-level bit and at least one low-level bit, before starting serial transmission of the data.

Here arises a problem. If the data is so encoded, the data-transmitting efficiency will decrease to 80%. Thus, the communications standard that imposes importance on high data-transmitting efficiency describes that the data bytes should be transmitted in series. Such communications standard allows for a so-called "consecutive identical digit (CID) period," in which bits of the same level, high or low, follow one after another.

The phase difference between the clock signal recovered and the data received increases with time if the clock signal generated in the transmitting device and the clock signal generated in the receiving devices may have different frequencies. In view of this, a tolerance is set for the clock frequency of the clock generator provided in the transmitting device. A tolerance is set for the clock frequency of the clock generator provided in the receiving device, too. These tolerances are of such values that the phase difference between the clock signals generated in the transmitting device and receiving device, which occurs during the longest CID period possible, is ½ bit or less for all bits that form the serial data.

Jpn. Pat. Appln. KOKAI Publication No. 4-127737 discloses a related technique. More precisely, this publication teaches a clock-generating circuit that can output a complete clock signal even if some bits are missing in any input signal that has been supplied from a transmitting device.

This clock-generating circuit may generate a clock signal the frequency of which exceeds the preset tolerance, because of the characteristics different from the designed ones or because of changes in temperature or voltage. If the CID period is based on statistical data, it may exceed the longest CID period at a particular probability. Consequently, the contents of the data received cannot be accurately determined.

To make matters worse, the data received has fluctuation known as "jitter." The jitter lowers the reliability of the data even if the receiving circuit that receives the data operates at so high a precision as described in the standard.

BRIEF SUMMARY OF THE INVENTION

According to a first aspect of the invention, there is provided a clock-recovering filter circuit for use in a clock recovery circuit that generates a recovery clock signal from input data from an external device and from a reference clock signal provided by external reference-clock generating circuit. The filter circuit comprises: a first input terminal which receives a first phase-advancing signal for advancing a phase of the recovery clock signal when the recovery clock signal is delayed with respect to the input data; a second input terminal which receives a first phase-delaying signal for delaying the phase of the recovery clock signal when the recovery clock signal is advancing with respect to the input data; a pulse-inserting circuit which inserts pulses in the first phase-advancing signal or the first phase-delaying signal, thereby generating a second phase-advancing signal or a second phase-delaying signal; and a frequency-offset detecting circuit which detects frequency-offset data from the second phase-advancing signal and the second phase-delaying signal, the frequency-offset data representing a frequency difference between the recovery clock signal and the reference clock signal. The pulse-inserting circuit inserts pulses in accordance with the frequency-offset data when the first phase-advancing signal or the first phase-delaying signal is not input.

According to a second aspect of this invention, there is provided a clock recovery circuit for generating a recovery clock signal from input data from an external device. The clock recovery circuit comprises: a reference-clock generating circuit which generates a reference clock signal; a phase-comparing circuit which compares the input data with the recovery clock signal, outputs a first phase-advancing signal when the recovery clock signal is delayed with respect to the input data, and outputs a first phase-delaying signal when the recovery clock signal is advancing with respect to the input data; a pulse-inserting circuit which inserts pulses in the first phase-advancing signal or the first phase-delaying signal, thereby generating a second phase-advancing signal or a second phase-delaying signal; a frequency-offset detecting circuit which detects frequency-offset data from the second phase-advancing signal and the second phase-delaying signal, the frequency-offset data representing a frequency difference between the recovery clock signal and the reference clock; and a phase-shifting circuit which generates the recovery clock signal from the reference clock signal and changes the phase of the recovery clock signal in accordance with the second phase-advancing signal or the second phase-delaying signal. The pulse-inserting circuit inserts the pulses in accordance with the frequency-offset data when the first phase-advancing signal or the first phase-delaying signal is not input.

BRIEF DESCRIPTION OF THE SEVERAL VIEWS OF THE DRAWING

FIG. 1 is a block diagram of a clock recovery circuit 1 according to a first embodiment of the present invention;

FIG. 6 is a block diagram of the clock-recovering filter circuit 5 shown in FIG. 1;

FIG. 7 is a block diagram of the frequency-offset detecting circuit 8 shown in FIG. 6;

FIG. 8 is a table for explaining the configuration of frequency-offset data SI;

FIG. 9 is a block diagram illustrating the pulse-inserting circuit 9 shown in FIG. 6;

FIG. 10 is a diagram depicting the overflow-detecting circuit 16 shown in FIG. 9;

FIG. 11 is a block diagram of the clock-recovering filter circuit 5 according to a second embodiment of this invention;

FIG. 14 is a circuit diagram of the 4-bit adder 14a used in the adder circuit 14 shown in FIG. 13;

FIG. 22 is a diagram representing the operation of the clock recovery circuit 1 that incorporates the pulse-inserting circuit 9a and the frequency-offset detecting circuit 8a.

DETAILED DESCRIPTION OF THE INVENTION

Figure 2:
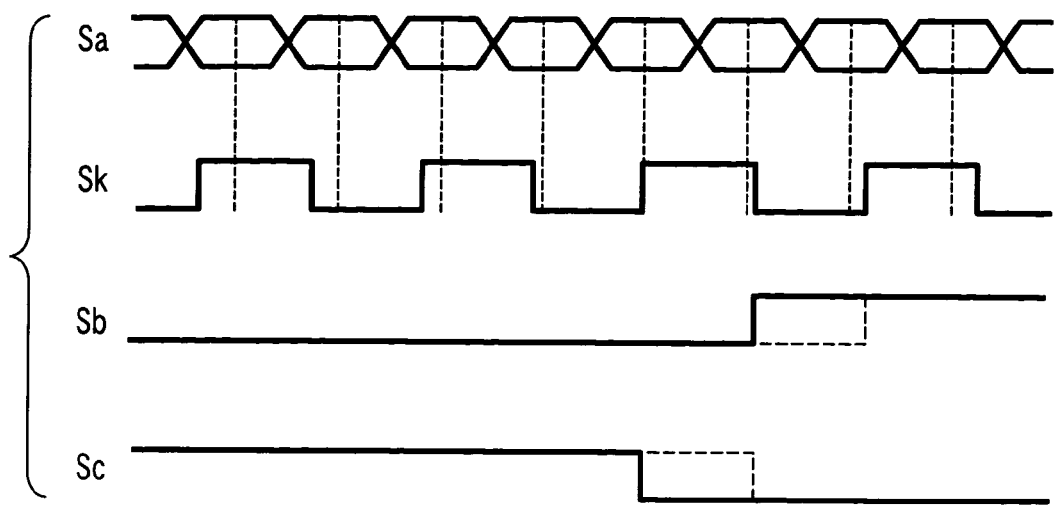
FIG. 2 is a timing chart illustrating when data is input to, and output from, the phase-comparing circuit 2 shown in FIG. 1.

Embodiments of this invention that has been made on the basis of the foregoing will be described with reference to the accompanying drawings. The components of each embodiment, which are identical to those of any other are designated at the same reference numerals in the drawings, and will be described repeatedly only if necessary.

First Embodiment

FIG. 1 is a block diagram of a clock recovery circuit 1 according to the first embodiment of the present invention. Not only in FIG. 1, but also in the other figures, thick lines indicate signal lines that convey multi-bit data.

The clock recovery circuit 1 comprises a phase-comparing circuit 2, an integration circuit 3, a discriminating circuit 4, a clock-recovering filter circuit 5, a phase-shifting circuit 6, and a reference-clock generating circuit 7.

The phase-comparing circuit 2 receives input data Sa. The input data Sa has been transmitted from a terminal that communicates with the terminal incorporating the clock recovery circuit 1. More correctly, the phase-comparing circuit 2 receives the input data Sa from the receiving circuit (not shown) of the terminal that incorporates the clock recovery circuit 1. The input data Sa is input, bit by bit, to the phase-comparing circuit 2. The phase-comparing circuit 2 receives a recovery clock signal Sk, too. The signal Sk is fed back from the phase-shifting circuit 6, which will be described later.

The phase-comparing circuit 2 compares the input data Sa with the recovery clock signal Sk in terms of phase. It generates a phase-advancing signal Sb and a phase-delaying signal Sc from the phase difference between the data Sa and the signal Sk. FIG. 2 is a timing chart that illustrates when the circuit 2 receives the data Sa and signal Sk and when it outputs the signals Sb and Sc.

As seen from FIG. 2, the phase-advancing signal Sb output from the phase-comparing circuit 2 is at high level to advance the phase of the recovery clock signal Sk, if the leading or trailing edge of the recovery clock signal Sk is delayed with respect to the center of any bit of the input data Sa. The phase-delaying signal Sc is at high level to delay the phase of the recovery clock signal Sk, if the leading or trailing edge of the recovery clock signal Sk advances with respect to the center of any bit of the input data Sa. In effect, however, the phase-advancing signal Sb and the phase-delaying signal Sc change in level with a time lag as indicated by the broken lines in FIG. 2. The time lag depends on the actual configuration of the phase-comparing circuit 2.

The phase-advancing signal Sb and the phase-delaying signal Sc, both output from the phase-comparing circuit 2, are input to the integration circuit 3. The circuit 3 integrates the signals Sb and Sc with each other, generating an integrated signal Sd. The integrated signal Sd is input to the discriminating circuit 4. From the signal Sd, the circuit 4 generates a phase-advancing signal Se, a phase-delaying signal Sf, and a reset signal Sg.

Figure 3:
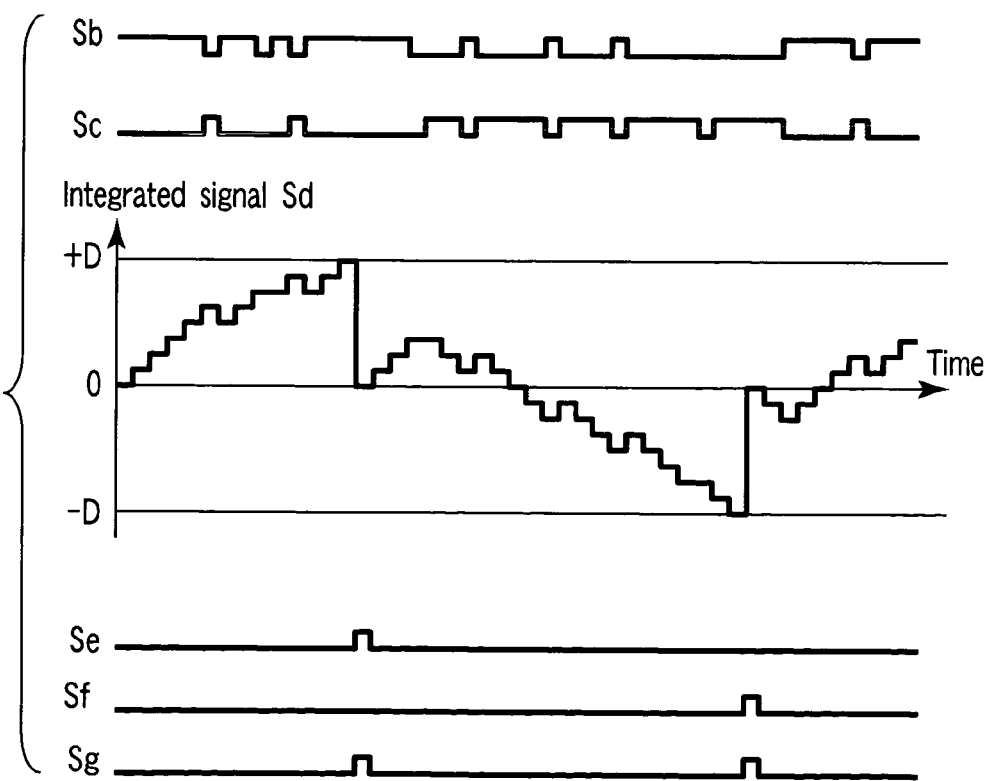
FIG. 3 is a timing chart illustrating when data is input to, and output from, the integration circuit 3 and the discriminating circuit 4, both shown in FIG. 1.

FIG. 3 is a timing chart illustrating when data is input to, and output from, the integration circuit 3 and the discriminating circuit 4. As mentioned above, the integration circuit 3 integrates the phase-advancing signal Sb and the phase-delaying signal Sc. The circuit 3 operates in synchronism with the leading and trailing edges of, for example, the recovery clock signal Sk. The circuit 3 increments the integrated signal Sd by one step if the phase-advancing signal Sb is at high level, and decrements the signal Sd by one step if the phase-delaying signal Sc is at high level.

The discriminating circuit 4 determines the level of the integrated signal Sd that the integration circuit 3 has generated. If the signal Sd rises above the positive threshold level (+D), the phase-advancing signal Se and the reset signal Sg, output from the discriminating circuit 4 are set at high level. The reset signal Sg is fed back to the integration circuit 3. Upon receipt of the reset signal Sg, the integration circuit 3 resets the integrated signal Sd. If the signal Sd falls below the negative threshold level (−D), the phase-delaying signal Sf and the reset signal Sg are set at high level. The reset signal Sg is fed back to the integration circuit 4 in this case, too. Upon receipt of the reset signal Sg, the integration circuit 4 resets the integrated signal Sd.

The integration circuit 3 and the discriminating circuit 4 are provided at the output of the phase-comparing circuit 2, for the following reason. Generally, the input data Sa and the recovery clock signal Sk contain a jitter at the fluctuation point. The jitter is noise developing in the direction of phase (or time). In FIG. 2, the center of each bit of the input data Sa rarely coincides with the leading or trailing edge of the recovery clock signal Sk.

Jitter, if contained in the input data Sa or the recovery clock signal Sk, shifts the fluctuation point of the data Sa or signal Sk for an extremely short time. Inevitably, the phase-comparing circuit 2 performs the phase comparison between the data Sa with the signal Sk, on the basis of the fluctuation point shifted. The phase-advancing signal Sb or the phase-delaying signal Sc, output from the phase-comparing circuit 2, therefore contains a high-frequency component that has frequently changed in level due to the jitter.

Any signal-processing circuit connected to the output of the phase-comparing circuit 2 may have a response time that is longer than the data-changing cycle of the phase-advancing signal Sb or the phase-delaying signal Sc. In this case, the operation of the clock recovery circuit 1 becomes unstable. To prevent this, the integration circuit 3 and the discriminating circuit 4 are provided at the output of the phase-comparing circuit 2. Thus, the input signals of any circuit which connected to the output of the discriminating circuit 4 change in level less frequently. The clock recovery circuit 1 can therefore operate stably as a whole.

The phase-advancing signal Se and the phase-delaying signal Sf, both generated by the discriminating circuit 4, are input to the clock-recovering filter circuit 5. The clock-recovering filter circuit 5 generates a phase-advancing signal Sh and a phase-delaying signal Si. The clock-recovering filter circuit 5 is designed to correct the phase of the signal Sk if the input data Sa has the CID period. Its configuration and operation will be described later. The phase-advancing signal Sh and the phase-delaying signal Si, both output from the clock-recovering filter circuit 5, are input to the phase-shifting circuit 6.

The reference-clock generating circuit 7 is connected to the phase-shifting circuit 6. The circuit 7 generates a reference clock signal Sj. The reference clock signal Sj has a frequency that is determined by the frequency of the clock signal generated by the clock generator provided in a transmitting device. The frequency difference between the reference clock signal Sj and the clock signal of the transmitting device is set within a standardized tolerant range. The reference-clock generating circuit 7 may not be used. If this is the case, the clock signal generated by any circuit peripheral to the clock recovery circuit 1 is used as reference clock Sj. The reference clock signal Sj is input to the phase-shifting circuit 6.

The phase-shifting circuit 6 generates the recovery clock signal Sk. The recovery clock signal Sk is a phase-shifted clock of the reference clock Sj. Phase shifting operation is performed step by step using the phase-advancing signal Sh and the phase-delaying signal Si by the phase-shifting circuit 6. More precisely, the phase-shifting circuit 6 shifts the phase of the recovery clock signal Sk forward by $2\pi/N$ radian at the leading edge of the phase-advancing signal Sh, and shifts the phase of the recovery clock signal Sk backward by $2\pi/N$ radian at the leading edge of the phase-advancing signal Si, where N is an predetermined integer which is greater than 0.

Figure 4:
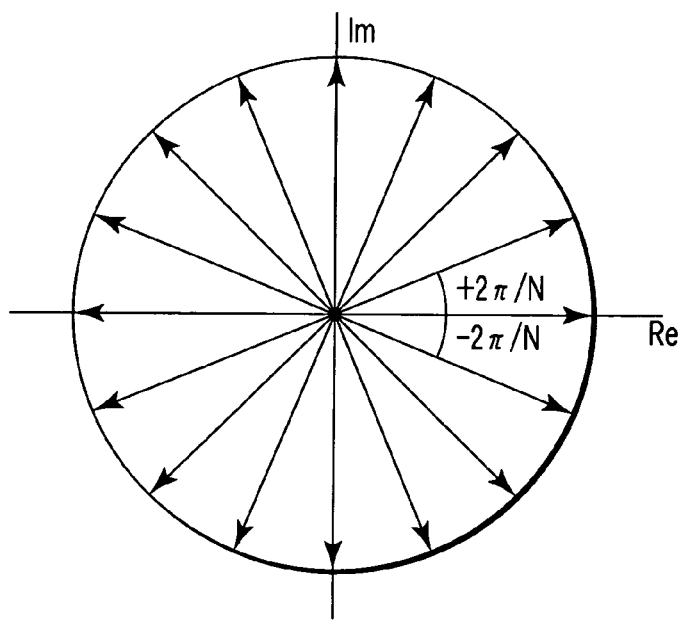
FIG. 4 is a diagram depicting the relative phase vectors that various recovery clock signals Sk have with respect to the reference clock signal Sj, the relative phase vectors plotted in a complex plane.

FIG. 4 is a diagram depicting the relative phase vectors that various recovery clock signals Sk have with respect to the reference clock signal Sj. The relative phase vectors are plotted in a complex plane. In FIG. 4, real numbers (Re) are plotted on the x-axis and imaginary numbers (Im) are plotted on the y-axis.

As seen from FIG. 4, the phase of the recovery clock signal Sk moves counterclockwise by $2\pi/N$ radian at the leading edge of the phase-advancing signal Sh and moves clockwise by $2\pi/N$ radian at the leading edge of the phase-delaying signal Si. Note that FIG. 4 is a diagram that schematically explains how the phase-shifting circuit 6 operates. Needless to say, the phase of the recovery clock signal Sk can be changed continuously instead of this stepping manner.

In effect, however, the reference clock signal Sj and the recovery clock signal Sk, respectively input and output from the phase-shifting circuit 6, are not always one phase. The clock recovery circuit 1 can generate clock signals that differ in phase. In other words, the clock recovery circuit 1 can generate recovery clock signals of different phases, from one input data Sa.

Figure 5:
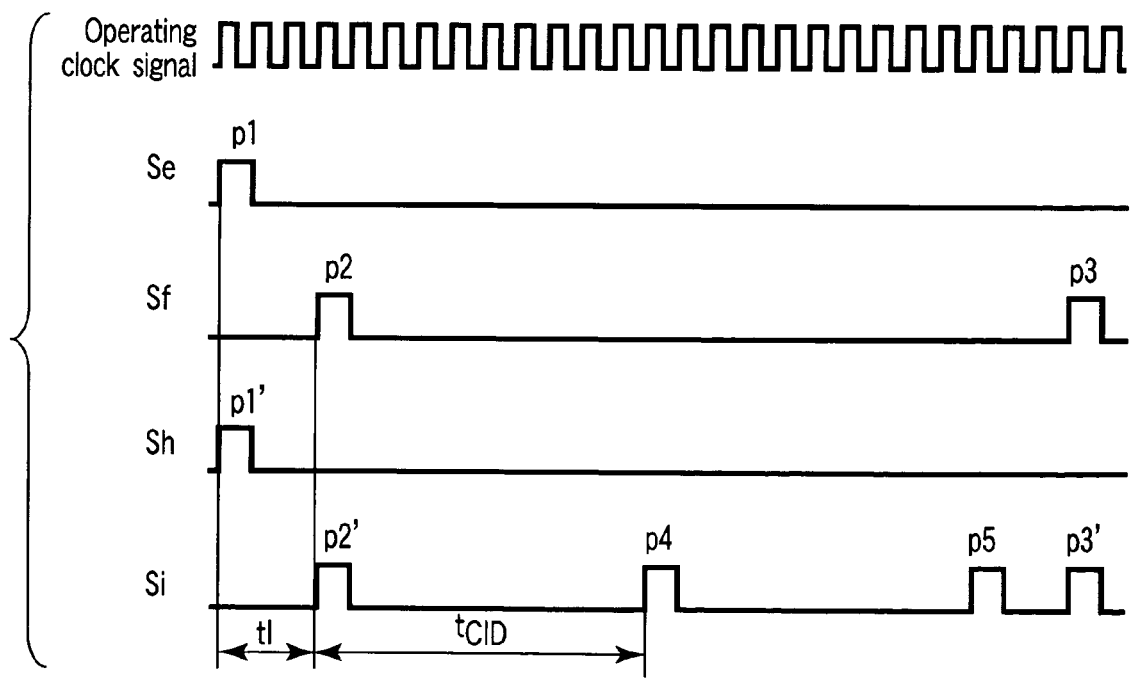
FIG. 5 is a timing chart illustrating when data is input to, and output from, the clock-recovering filter circuit 5 shown in FIG. 1.

The clock-recovering filter circuit 5 will be described. FIG. 5 is a timing chart that illustrates when data is input to, and output from, the clock-recovering filter circuit 5.

The operating clock signal for the clock-recovering filter circuit 5 is one generated by dividing the frequency of, for example, the recovery clock signal Sk. The clock-recovering filter circuit 5 detects the frequency offset of the recovery clock signal Sk to the reference clock signal Sj from the phase-advancing signal Se and the phase-delaying signal Sf, both input to it. The data representing this frequency offset is stored in the memory incorporated in the circuit 5.

In the clock-recovering filter circuit 5, the interval t1 between the leading edges of two successive phase-advancing signals Se, between two successive phase-delaying signal Sf, or between one phase-advancing signals Se and one succeeding phase-delaying signal Sf may be shorter or equal to the period $t_{CID}$ of the phase-advancing signal Sh or the phase-delaying signal Si that is used to compensate the frequency offset represented by the data stored in the clock-recovering filter circuit 5. If this is the case, the phase-advancing signal Sh and the phase-delaying signal Si are identical to the phase-advancing signal Se and the phase-delaying signal Sf, respectively. As FIG. 5 shows, pulses p1 and p2 are output as pulses p1' and p2'.

Assume that the interval t1 is longer than the period $t_{CID}$. Then, the clock-recovering filter circuit 5 inserts a pulse having a leading-edge interval equal to the period $t_{CID}$ into the phase-advancing signal Sh if the frequency offset has a positive value (that is, if the recovery clock signal Sk has a higher frequency than the reference clock signal Sj). If the frequency offset has a negative value (that is, if the recovery clock signal Sk has a lower frequency than the reference clock signal Sj), the circuit 5 inserts a pulse having leading-edge interval equal to the period $t_{CID}$ into the phase-delaying signal Si. FIG. 5 shows the case where the frequency offset has a negative value. Pulses p4 and p5 are inserted in the phase-delaying signal Si.

The clock-recovering filter circuit 5 calculates an appropriate interval for each pulse, thus determining the period $t_{CID}$. The length of $t_{CID}$ can not be always justly divided by the cycle of the recovery clock signal Sk. Generally, the reminder of this division is not 0. The reminders are used to determine the next pulse inserting position. The circuit 5 finds the remaining frequency offset that cannot be compensated by inserting pulse p4 into the phase-delaying signal Si as shown in FIG. 5. Then, from the remaining frequency offset, the circuit 5 determines the timing for pulse p5 that should be inserted into the signal Si in order to compensate the frequency offset completely through total operation.

When the phase-advancing signal Se or phase-delaying signal Sf rises after the phase-advancing signal Sh or phase-delaying signal Si, the clock-recovering filter circuit 5 outputs the signal Se as phase-advancing signal Sh or outputs the signal Sf as phase-delaying signal Si. In the case shown in FIG. 5, the circuit 5 outputs the pulse p3 in the phase-delaying signal Sf, as pulse p3' in the phase-delaying signal Si.

FIG. 6 is a block diagram of the clock-recovering filter circuit 5 shown in FIG. 1. As FIG. 6 depicts, the circuit 5 comprises a frequency-offset detecting circuit 8 and a pulse-inserting circuit 9. The frequency-offset detecting circuit 8 detects frequency-offset data SI from the phase-advancing signal Sh and the phase-delaying signal Si, both output from the pulse-inserting circuit 9. The frequency-offset data SI is supplied to the pulse-inserting circuit 9.

The pulse-inserting circuit 9 calculates, from the frequency-offset data S1, the maximum (leading-edge) interval that a pulse must acquire to compensate the frequency offset. When the interval of the phase-advancing signal Se or phase-delaying signal Sf becomes longer than the maximum interval thus calculated, the circuit 9 inserts a pulse into the phase-advancing signal Se or phase-delaying signal Sf and outputs the phase-advancing signal Sh or the phase-delaying signal Si.

FIG. 7 is a block diagram of the frequency-offset detecting circuit 8 shown in FIG. 6. The frequency-offset detecting circuit 8 comprises an up-down counter 10, a register circuit 11, and a timer circuit 12. The up-down counter 10 counts either of leading or trailing edges of operating clock signal depicted in FIG. 5. The count of the up-down counter 10 increases while the phase-advancing signal Sh is at high level and decreases while the phase-delaying signal Si is at high level. The up-down counter 10 stops counting if the both of the Sh and Si are at low level.

The timer circuit 12 outputs control pulses Sn at predetermined intervals. The control pulses Sn act as reset signals for the up-down counter 10 and as latch signals for the register circuit 11. Thus, when a control pulse Sn rises, the register circuit 11 holds the count Sm of the up-down counter 10 and the count of the up-down counter 10 is reset to zero. The intervals are a design parameter, which is based on the ability demanded of the frequency-offset detecting circuit 8. The longer the intervals, the higher the precision of measuring the frequency offset will be. The shorter the intervals, the faster the phase can be corrected, at the expense of the precision of measuring the frequency offset.

The register circuit 11 outputs the data it has been holding, as frequency-offset data SI. The frequency-offset data SI consists of a prescribed number of bits. The data SI includes a data item that represents the polarity of the frequency difference. FIG. 8 is diagram for explaining the frequency-offset data SI.

For simplicity of explanation, assume that the frequency-offset data SI consists of three bits as is illustrated in FIG. 8. As FIG. 8 shows, the data SI represents a 2's complement. Hence, the most significant bit of the data SI indicates the polarity of the data SI. In the first embodiment, the most significant bit indicates positive polarity if it is "0." The notation of the data Si is not limited to a 2's complement. Any other notation can be used so long as it can represent positive polarity and negative polarity.

FIG. 9 is a block diagram illustrating the pulse-inserting circuit 9 shown in FIG. 6. The circuit 9 is designed to operate if the frequency-offset data SI is binary data that represents a 2's complement.

The pulse-inserting circuit 9 comprises two registers 13a and 13b, an adder circuit 14, an exclusive-OR circuit 15, an overflow-detecting circuit 16, two selectors 17a and 17b, an OR circuit 18 and an inverter circuit 19.

The phase-advancing signal Se and the phase-delaying signal Sf, both output from the discriminating circuit 4, are input via input terminals T1 and T2 to the pulse-inserting circuit 9. In the circuit 9, the phase-advancing signal Se is input to the selector 17a and the OR circuit 18, and the phase-delaying signal Sf is input to the selector 7b and the OR circuit 18. The OR circuit 18 outputs a reset signal Sr at high level when one of the two input signals or both are at high level.

The reset signal Sr is input to the register 13b. Upon receiving the reset signal Sr, the register 13b resets the data it is holding.

In the pulse-inserting circuit 9, the frequency-offset data SI input from the frequency-offset detecting circuit 8 is input to the adder circuit 14. The data Sq output from the register 13b is input to the adder circuit 14, too. The adder circuit 14 adds the frequency-offset data SI and the data Sq, generating data So. The data So is input to the register 13b.

The most significant bit $I_{MSB}$ Of the frequency-offset data SI, the most significant bit $o_{MSB}$ Of the sum data So and the most significant bit $q_{MSB}$ of the output data Sq are input to the overflow-detecting circuit 16. The circuit 16 detects an overflow in the data So output from the adder circuit 14.

The term "overflow" as used herein means that the sum obtained by the adder circuit 14 can no longer be represented by the number of bits that the circuit 14 can output. The overflow will occur when the adder circuit 14 adds two data items which have same polarity and are not "0." This is because the sum obtained acquires an absolute value greater than each of the data items input to the adder circuit 14.

The bit width of the data So output from the adder circuit 14 is a design parameter. It is determined by the cycle of the control pulse Sn (i.e., timer cycle) output from the timer circuit 12 that is shown in FIG. 7. The frequency-offset data SI is proportional to the difference obtained by subtracting the period the phase-delaying signal Si repeatedly remains at high level during one timer cycle from the period the phase-advancing signal Sh repeatedly remains at high level during the identical timer cycle. The maximum and minimum value of the difference is plus (+) and minus (−) one timer cycle respectively. The bit width of the data So is determined so that it can represent +/−one timer cycle. If the thresholds for the +/−overflow are set at the values correspond to the +/−one timer cycle, the insertion timing of pulses, which compensate frequency offset of the recovery clock signal Sk to the reference clock signal Sj, can be known by detecting the (+/−) overflows.

The overflow is detected as will be described below. Assume that the frequency-offset data SI, the data So (output from the adder circuit 14) and the data Sq (output from the register 13b) are binary data items. First, the overflow-detecting circuit 16 determines whether the most significant bit $I_{MSB}$ and the most significant bit $q_{MSB}$ are identical. If these bits $I_{MSB}$ and $q_{MSB}$ are identical, the circuit 16 determines whether the bit $I_{MSB}$ or $q_{MSB}$ is identical to bit $o_{MSB}$.

It is determined that an overflow has occurred if $I_{MSB}$ equals $q_{MSB}$ and if $I_{MSB}$ (or $q_{MSB}$, they are identical in the first condition) is different from $o_{MSB}$. In other words, an overflow is detected if the output data of the adder circuit 14 (So) has different polarity from the input data of the adder (Sq) when the two input data of the adder (Sl and Sq) have the same polarity.

FIG. 10 is a circuit diagram depicting the overflow-detecting circuit 16. As FIG. 10 shows, the circuit 16 comprises an exclusive-NOR circuit 20, an exclusive-OR circuit 21, and an AND circuit 22.

The most significant bit $I_{MSB}$ and the most significant bit $q_{MSB}$ are input to the exclusive-NOR circuit 20. The output signal of the exclusive-NOR circuit 20 goes to high level if and only if the two bits $I_{MSB}$ and $q_{MSB}$ are identical. The most significant bit $q_{MSB}$ and the most significant bit $o_{MSB}$ are input to the exclusive-OR circuit 21. The output signal of the exclusive-OR circuit 21 goes to high level if and only if the two bits $q_{MSB}$ and $o_{MSB}$ are different. The output signal of the exclusive-NOR circuit 20 and the output signal of the exclusive-OR circuit 21 are input to the AND circuit 22. The output signal of the AND circuit 22, which is the overflow signal Ss, goes to high level if and only if both of the two input signals of it are high level.

The overflow signal Ss output from the overflow-detecting circuit 16 is at high level when an overflow occurs in the data So. The overflow signal Ss is at low level when no overflow occurs in the data So. As shown in FIG. 9, the overflow signal Ss is input to the register 13a and the exclusive-OR circuit 15.

The register 13a holds the overflow signal Ss supplied from the overflow-detecting circuit 16. The register 13a outputs the held signal as control signal Su. The control signal Su is input to the selectors 17a and 17b.

The most significant bit $q_{MSB}$ of the data Sq output from the register 13b is input to the selector 17b and inverter circuit 19. The inverter circuit 19 inverts its input $q_{MSB}$. The output signal of the inverter circuit 19 is input to the selector 17a.

The selector 17a selects the phase-advancing signal Se if the control signal Su is at low level. If the control signal Su is at high level, the selector 17a selects the signal output from the inverter circuit 19. Similarly, the selector 17b selects the phase-delaying signal Sf if the control signal Su is at low level, and selects the most significant bit $q_{MSB}$ if the control signal Su is at high level. The pulse-inserting circuit 9 outputs the phase-advancing signal Sh and the phase-delaying signal Si from the output terminals OT1 and OT2, respectively.

The overflow signal Ss output from the overflow-detecting circuit 16 and the most significant bit $o_{MSB}$ of the data So are input to the exclusive-OR circuit 15. The exclusive-OR circuit 15 inverts only the most significant bit of the data So if the overflow signal Ss is at high level. The most significant bit thus inverted is input, as overflow data Sp, to the register 13b.

The overflow data Sp represents how large the overflow is, which is occurring in the data So output from the adder circuit 14. Whenever the overflow-detecting circuit 16 detects an overflow, the register 13b holds the sum of the overflow data Sp, i.e., initial value, and the frequency-offset data SI.

How the pulse-inserting circuit 9 thus configured operates will be explained. If the phase-advancing signal Se or the phase-delaying signal Sf is at high level, the OR circuit 18 resets the register 13b. This is because no long CID periods exist. In this case, the recovery clock signal Sk can be corrected in phase by the phase-advancing signal Se and the phase-delaying signal Sf.

Just after the register 13b is reset, no overflow occurs in the data So since the So is generated by adding the data Sq output from the register 13b to the frequency-offset data SI by the adder circuit 14. The control signal Su output from the register 13a therefore falls to low level. The selector 17a selects and outputs the phase-advancing signal Se, and the selector 17b selects and outputs the phase-delaying signal Sf.

While the phase-advancing signal Se and the phase-delaying signal Sf remain at low level, the register 13b is not reset. The register 13b therefore accumulates items of the frequency-offset data SI. If the frequency-offset data SI has a tendency to represent a positive value, the data So output from the adder circuit 14 increases with time. If the data SI has a tendency to represent a negative value, the data So decreases with time. Hence, an overflow may occur in the data So output from the adder circuit 14.

The register 13a holds the overflow signal Ss, and the control signal Su output from the register 13a rises to high level. As a result, the selector 17a outputs, as phase-advancing signal Sh, the signal obtained by inverting the most significant bit $q_{MSB}$ of the data Sq output from the register 13b. The signal Sh is at low level if the most significant bit $q_{MSB}$ is "1," and is at high level if the most significant bit $q_{MSB}$ is "0." On the other hand, the selector 17b outputs the most significant bit $q_{MSB}$ as the phase-delaying signal Si.

The exclusive-OR circuit 15 inverts the most significant bit of the data So. The data So thus processed is supplied, as overflow data Sp, to the register 13b. The overflow no longer exists in the next operation cycle, and the register 13b holds the overflowing part of data. In the next operation cycle, the frequency-offset data Sl is added to the overflow data Sp, which is the initial value.

Every time an overflow takes place, the pulse-inserting circuit 9 outputs a pulse that is either the phase-advancing signal Sh or the phase-delaying signal Si. The greater the absolute value of the frequency-offset data SI, the higher the probability of an overflow. Hence, the intervals at which pulses are generated are inversely proportional to the frequency offset. The pulse inserted in the phase-advancing signal Sh or the phase-delaying signal Si compensates the frequency offset of the recovery clock signal Sk to the reference clock signal Sj. As a result of the frequency-offset compensation, the frequency difference between the reference clock signals of a transmitting device and a receiving device is absorbed.

As described above in detail, the frequency difference between the recovery clock signal Sk and the reference clock signal Sj is determined from the phase-advancing signal Sb or the phase-delaying signal Sc, either output from the phase-comparing circuit 2, in the present embodiment. The cycle of the phase-advancing signal or the phase-delaying signal, which is used to compensate the frequency difference (or frequency offset) is calculated. If the pulse interval in the phase-advancing or -delay signal output from the phase-comparing circuit 2 is longer than the calculated cycle, the pulse-inserting circuit 9 inserts a pulse in the phase-advancing signal or the phase-delaying signal, in accordance with whether the frequency offset has a positive value or a negative value.

To insert the next pulses in the phase-advancing signal or the phase-delaying signal, the circuit 9 calculates the remaining frequency offset that has not been compensated by inserting the pulses. From the remaining frequency offset, the circuit 9 determines the next-pulse insert timing to compensate the frequency offset completely through total operation. Thus, the recovery clock signal Sk can be changed in phase in accordance with the frequency difference between the recovery clock signal Sk and the reference clock signal Sj in the first embodiment, even if the input data Sa contains consecutive identical digit (CID) period, in which bits of the same level, high or low, follow one after another. A permissible range of the CID period can therefore be long.

The recovery clock signal Sk can be corrected in terms of phase even if the frequency of the reference clock signal Sj exceeds the tolerant range due to variance of fabrication-process parameters or to changes in temperature or voltage. The clock recovery circuit 1 can therefore generate a correct recovery clock signal Sk.

If pulses are inserted in the phase-advancing signal Sh or the phase-delaying signal Si, changing the phase of the recovery clock signal Sk, the intervals at which to insert next pulses is calculated by using the remaining frequency offset that could not be compensated by inserting previous pulses. The intervals thus determined are optimal ones. Thus, the frequency offset can successfully be compensated by inserting pulses at the intervals determined from the frequency offset and from the remaining frequency offset calculated in every operation cycle.

The first embodiment includes the integration circuit 3 and the discriminating circuit 4. Nonetheless, these circuits 3 and 4 can be dispensed with. Without the integration circuit 3 or the discriminating circuit 4, the first embodiment can achieve the same advantages as described above.

Second Embodiment

The second embodiment of the invention is characterized in the minimized influence of the gain of the feedback loop comprising the frequency-offset detecting circuit 8, data lines which conveying frequency-offset data Sl, the pulse-inserting circuit 9, and signal lines which conveying phase-advancing and -delaying signal Sh and Si to the frequency-offset detecting circuit 8, in the clock-recovering filter circuit 5 that is illustrated in FIG. 6.

FIG. 11 is a block diagram of a clock-recovering filter circuit 5 according to the second embodiment. The components of the filter circuit 5, which are identical to those of the clock-recovering filter circuit depicted in FIG. 6 are designated at the same reference numerals and will not be described in detail.

The clock-recovering filter circuit 5 comprises a frequency-offset detecting circuit 8, a pulse-inserting circuit 9, a selector 24, and register 25.

The frequency-offset detecting circuit 8 detects frequency-offset data SI. The frequency-offset data SI is input to one of the two input terminals of the selector 24. The pulse-inserting circuit 9 incorporates an OR circuit 18 (not shown), which outputs a reset signal Sr. The reset signal Sr is input to the control input terminal of the selector 24.

The selector 24 outputs frequency-offset data SI', which is input to the register 25. The register 25 outputs frequency-offset data SI". The data SI" is input to the pulse-inserting circuit 9 and to the other input terminal of the selector 24.

The selector 24 selects the frequency-offset data SI if the reset signal Sr is at high level. If the reset signal Sr is at low level, the selector 24 selects the frequency-offset data SI".

In the clock-recovering filter circuit 5 (FIG. 6), the pulse-inserting circuit 9 converts the frequency-offset data SI to two pulses, i.e., phase-advancing signal Sh and phase-delaying signal Si, if both the phase-advancing signal Se and the phase-delaying signal Sf are at low level. The data SI (more correctly, phase-advancing signal Sh and phase-delaying signal Si that reflect the frequency offset) is supplied via a feedback loop to the frequency-offset detecting circuit 8 and is held in the circuit 8.

The frequency-offset data SI remains unchanged if the gain of the feedback loop is 1. If the gain of the feedback loop is less than 1, the value of the data SI decreases with time. If the gain of the feedback loop is greater than 1, the value of the data SI will increase with time.

In the clock-recovering filter circuit 5, the selector 24 is provided between, and connected to, the frequency-offset generating circuit 8 and the pulse-inserting circuit 9. The register 25 is provided between, and connected to, the pulse-inserting circuit 9 and the selector 24. The register 25 temporarily stores the frequency-offset data SI'. The pulse-inserting circuit 9 outputs a reset signal Sr. The reset signal Sr is supplied, as a control signal, to the selector 24.

If the reset signal Sr is at low level, the selector 24 selects the frequency-offset data SI" output from the register 25, instead of the frequency-offset data SI. Hence, the frequency-offset data SI" whose value has neither increased nor decreased is supplied to the pulse-inserting circuit 9 when both the phase-advancing signal Se and the phase-delaying signal Sf are at low level. The gain obtained in the feedback loop would not influence the frequency-offset data SI. This ensures the stable operation of the clock-recovering filter circuit 5.

As indicated above, in the second embodiment, the frequency-offset data SI" not influenced by the gain in the feedback loop can be supplied to the pulse-inserting circuit 9 even if the frequency-offset data SI changes due to the gain of the feedback loop. Since the gain of the feedback loop imposes no influence on the frequency-offset data SI", the clock-recovering filter circuit 5 can operate in stable state, which ultimately stabilizes the clock recovery circuit 1.

Third Embodiment

Figure 12:
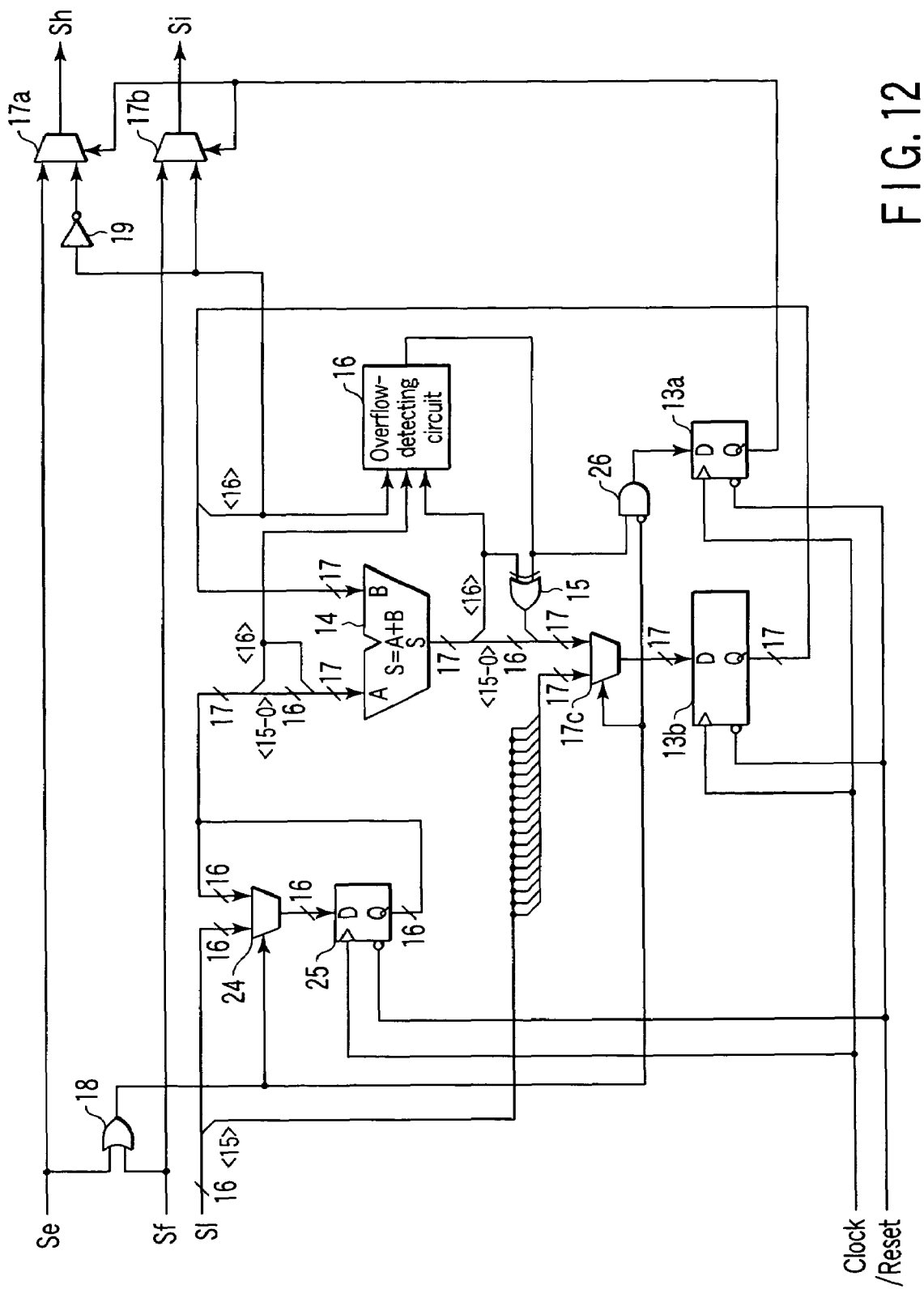
FIG. 12 is a circuit diagram of a pulse-inserting circuit 9a according to a third embodiment of the invention.

The third embodiment of this invention is characterized by comprising a pulse-inserting circuit 9a that differs from the pulse-inserting circuit 9 shown in FIG. 9. FIG. 12 is a circuit diagram of the pulse-inserting circuit 9a.

As FIG. 12 depicts, the pulse-inserting circuit 9a comprises three registers 13a, 13b and 25, an adder circuit 14, an exclusive-OR circuit 15, an overflow-detecting circuit 16, four selectors 17a, 17b, 17c, and 24, an OR circuit 18, an inverter circuit 19, and an AND circuit 26. The overflow-detecting circuit 16 is, for example, the type illustrated in FIG. 10. The adder circuit 14 is a 17-bit adder. In FIG. 12, the numeral assigned to each signal lines indicates the bit width of the signal line. In FIG. 12, "<0>" is the first bit of 17-bit data, and "<16>" is the seventeenth bit of the 17-bit data.

In the third embodiment, the pulse-inserting circuit 9a is identical to the pulse-inserting circuit 9 (FIG. 9), except that it comprises a selector and a register that is identical, respectively, to the selector 24 and register 25 that are illustrated in FIG. 11. A clock signal Clock and a reset signal /Reset are input to the pulse-inserting circuit 9a. The clock signal Clock is a signal generated by dividing the frequency of the recovery clock signal Sk, like the operating clock signal supplied to the clock-recovering filter circuit 5 described above. Alternatively, the clock signal Clock may be supplied from an external device. The reset signal /Reset is supplied from, for example, an external device. The reset signal /Reset is a system reset signal that is input when the clock recovery circuit 1 starts operating.

When the reset signal /Reset falls to low level, the bits held in the registers 13a, 13b and 25 are reset to "0s" (i.e., all bits held in them are at low level). These registers acquire data at the data-input terminals (D) at the leading edge of a pulse of the clock signal Clock and output the data from the data-output terminals (Q). They hold the data during the leading edge of the next pulse of the clock signal Clock.

Assume the signal Se or the signal Sf is at high level. Then, the OR circuit 18 outputs a signal at high level. The two selectors 24 and 17c, which receives the signal output from the OR circuit 18, select the signals they receive at their left input terminals. Thus, the frequency-offset data SI is supplied via the selector 24 to the register 25. The most significant bit $I_{MSB}$ of the frequency-offset data SI is expanded to the same bit width as that (i.e., 17 bits) of the register 13b. The data expanded is input via the selector 17c to the register 13b.

Meanwhile, the signal output from the OR circuit 18 is inverted and input to one input terminal of the AND circuit 26. This is because the data is inverted at this input terminal of the AND circuit 26, as is indicated by mark "o." Hereinafter, the mark "o" assigned to one input terminal of any gate circuit means that the data is inverted at that input terminal. Thus, the signal supplied to this input terminal of the AND circuit 26 is at low level if the output signal of the OR circuit 18 is at high level, and the output signal of the AND circuit 26 is at low level. The signal thus supplied, at low level, is input to the register 13a. At the leading edge of the next pulse of the clock signal Clock, the frequency-offset data SI is stored into the register 25.

All bits of the data output from the register 13b are reset to "0" if the frequency-offset data SI is positive, and are reset to "1" if the data SI is negative. The signal output from the register 13a is reset to "0." As a result, the selectors 17a and 17b select the signals Se and Sf, respectively. Hence, Sh=Se and Si=Sf.

The reset data supplied to the register 13b is switched in accordance with whether the frequency-offset data SI has a positive value or a negative value, for the following reason. In the notation of 2's complement, any binary number is positive or negative, depending on the value of the most significant bit. Assume that two binary numbers consists of the same number of bits and that the most significant bit of the first is "0" while the most significant bit of the second is "1." Then, the first binary member may consist of "0s" only; it may be "0" of decimal notation. Number "0" is neither positive nor negative. Hence, positive numbers that can be expressed as 2' complements are one less than negative numbers that can be expressed as 2' complements.

Consider eight 3-bit frequency-offset data items SI shown in FIG. 8. Of these data items SI, three (i.e., 1, 2 and 3) are positive, and four (i.e., −1, −2, −3 and −4) are negative. By resetting all bits of the register 13b to "1s" (i.e., decimal "−1") if the frequency-offset data Sl is negative, the tolerance of overflow can be the same for positive decimal numbers and negative decimal numbers. If an overflow occurs in the data So output from the adder circuit 14, the exclusive-OR circuit 15 inverts the most significant bit. The binary number thus obtained may consist of "0s" only, representing decimal "0," if the overflow is a positive one. If the overflow is a negative one, however, the binary number will not consist of "0s" only, thus not representing decimal "0." Thus, the tolerance of the next overflow is the same for positive decimal numbers and negative decimal numbers.

Assume that both signal Se and signal Sf are at low level. Then, the output of the OR circuit 18 falls to low level. The selectors 24 and 17c, which receives this output signal from the OR circuit 18, select the signals they receive at their right input terminals. Thus, the output of the register 25 is fed back to the register 25 through the selector 24, and the 17-bit data, i.e., the sum of the lower 16 bits of the output from the adder circuit 14 and one bit output from the exclusive-OR circuit 15, is input to the register 13b through the selector 17c. The output of the OR circuit 18 is inverted and then input to the AND circuit 26.

If the output of the OR circuit 18 is at low level, the signal obtained by inverting the output of the OR circuit 18 is therefore at high level. As a result, the output of the AND circuit 26 is identical to the output of the overflow-detecting circuit 16. The output of the AND circuit 26 is input to the register 13a. At the next leading edge of the clock signal, the register 25 holds the data it has received.

The register 13b holds 17-bit data, which is the sum of the lower 16 bits of the output from the adder circuit 14 and one bit output from the exclusive-OR circuit 15. The register 13a holds the output of the AND circuit 26.

The output of the register 13a remains "0" when the output of the overflow-detecting circuit 16 is at low level even if both signal Se and signal Sf are at low level. In this case, the selectors 17a and 17b selects signals Se and Sf, respectively. Hence, Sh=Se, Si=Sf.

The output of the exclusive-OR circuit 15 is identical to the most significant bit of the output from the adder circuit 14. The adder circuit 14 adds the data held in the register 25 and the output of the register 13b. The circuit 14 performs this addition at each leading edge of the clock signal Clock. Therefore, the register 13b gradually accumulates data held in the register 25. The accumulated data in the register 13b finally exceeds the maximum or minimum value which can be represented by the bit width (i.e., 17 bits) of the adder circuit 14 or register 13b. At this time, an overflow occurs.

When both signal Se and Signal Sf are at low level, an overflow may occur in the adder circuit 14. If an overflow occurs, the output of the overflow-detecting circuit 16 rises to high level. As a result, the output of the AND circuit 26 rises to high level. The most significant bit of the data output from the adder circuit 14 is inverted by the exclusive-OR circuit 15. The data, the most significant bit of which has been thus inverted, is held in the register 13b at the next leading edge of the clock signal Clock. The data output from the overflow-detecting circuit 16 is held in the register 13a at the next leading edge of the clock signal Clock. When the output of the register 13a rises to high level, the selectors 17a and 17b select the output and input of the inverter 19 respectively, which is the inverted and non-inverted most significant bit of the output of the register 13b.

Hence, Sh=1 and Si=0 if the frequency-offset data SI held in the register 25 has a positive value. The phase of the recovery clock signal is advances. If the frequency-offset data SI held in the register 25 has a negative value, Sh=0 and Si=1. In this case, the phase of the recovery clock signal is delayed.

By inverting the most significant bit of the data output from the adder circuit 14, the exclusive-OR circuit 15 subtracts the data of $2^{16}$ from the output of the adder circuit 14 if the frequency-offset data SI have a positive value, and adds the data of $2^{16}$ to the output of the adder circuit 14 if the frequency-offset data SI have a negative value. As a result, any data excessive of an overflow from the greatest or least data (i.e., $2^{16}-1$ or $-2^{16}$) that can be displayed remains in the register 13b. This prevents an overflow at the input of the register 13b. At the next leading edge of the clock signal Clock, the output of the register 13a falls back to "0." Thus, Sh=Se, and Si=Sf.

The data accumulation continues as long as signals Sh and Se remain "0." Nonetheless, the initial value held in the register 13b is the data excessive of an overflow from the greatest or least data that can be displayed. Therefore, the intervals between pulses to be inserted can be determined at the same accuracy as in the case where the data accumulation is continued with wider (or infinite) bit-width adder and register.

Figure 13:
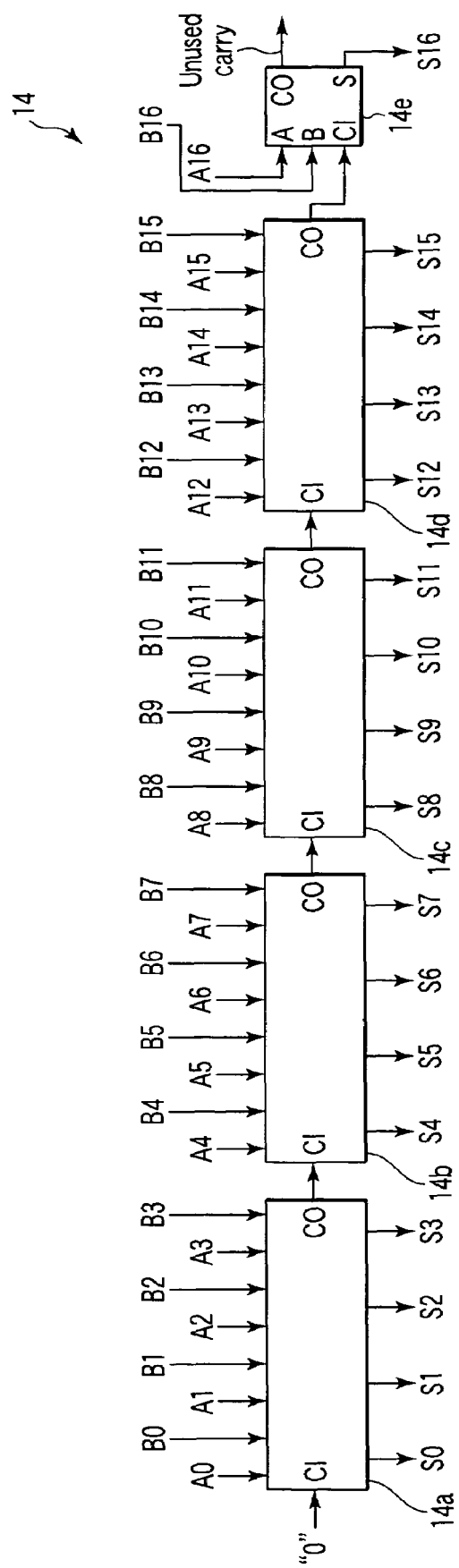
FIG. 13 is a block diagram of a circuit that is used as adder circuit 14 in the pulse-inserting circuit 9a shown in FIG. 12.

FIG. 13 is a block diagram of the adder circuit 14 incorporated in the pulse-inserting circuit 9a shown in FIG. 12. As FIG. 13 shows, the adder circuit 14 comprises four 4-bit adders 14a, 14b, 14c and 14d, and a full adder 14e.

The adder circuit 14 adds two a 17-bit data item A<16-0> and a 17-bit data item B<16-1>, generating data S<16-0>. In the adder circuit 14, the carry-output terminals CO of the 4-bit adders 14a, 14b and 14c are connected to the carry-input terminals CI of the 4-bit adders 14b, 14c and 14d, respectively. The carry-output terminal CO of the 4-bit adder 14d is connected to the carry-input terminal CI of the full adder 14e. One "0" bit is input to the carry-input terminal of the first 4-bit adder 14a.

The carry-output terminal CO of the full adder 14e is connected to nothing, because the carry signal output from the full adder 14e is not used at all.

FIG. 14 is a circuit diagram of the 4-bit adder 14a used in the adder circuit 14 shown in FIG. 13. Note that the other 4-bit adders 14b, 14c and 14d provided in the adder circuit 14 are identical in structure to the 4-bit adder 14a.

As FIG. 14 depicts, the adder 14a comprises full adders 27a, 27b, 27c and 27d, AND circuits 28a, 28b, 28c, 28d and 28e, OR circuits 29a, 29b, 29c and 29d, exclusive-OR circuits 30a, 30b, 30c and 30d, and selectors 31a and 31b.

The 4-bit adder 14a adds two 4-bit data items A<3-0> and B<3-0>, with an input carry signal CI, thus generating sum data S<3-0> and an output carry signal Co. The adder 14a uses a carry look-ahead (CLA) circuit that generates a carry. The transfer delay is short. That is, the period between the change in a carry-input signal CI and the generation of a carry-output signal CO. With so configured 4-bit adders 14a-d, the adder circuit 14 depicted in FIG. 13 can operate faster than a 17-bit carry-ripple adder that is composed of full adders only.

Figure 15:
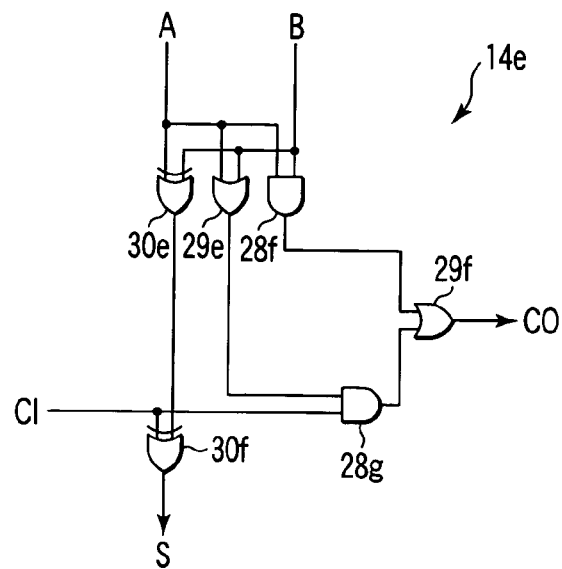
FIG. 15 is a circuit diagram of the full adder 14e incorporated in the adder circuit 14 shown in FIG. 13.

FIG. 15 is a circuit diagram of the full adder 14e incorporated in the adder circuit 14 shown in FIG. 13. Note that the full adders 27a, 27b, 27c and 27d, all shown in FIG. 14, are of the same configuration as the full adder 14e.

As illustrated in FIG. 15, the full adder 14e comprises AND circuits 28f and 28g, OR circuits 29e and 29f and exclusive-OR circuits 30e and 30f.

The full adder 14e receives 1-bit data items A and B and an input carry signal CI. It adds the 1-bit data items A and B, with the input carry signal CI, generating a logic sum S and an output carry signal CO. In the full adder 14e, the AND circuit 28g and the OR circuit 29f constitute a carry propagation path for the signal CI, from which the output carry signal CO can be generated. Hence, the output carry signal CO can be generated within a short time from the change in the input carry signal CI.

The third embodiment described above can achieve the same advantages as the first embodiment. The third embodiment is advantageous in another respect. The gain in the feedback loop for the phase-advancing signal Sh or phase-delaying signal Si (generated by the pulse-inserting circuit 9) imposes only a little influence on the frequency-offset data SI.

Fourth Embodiment

Figure 16:
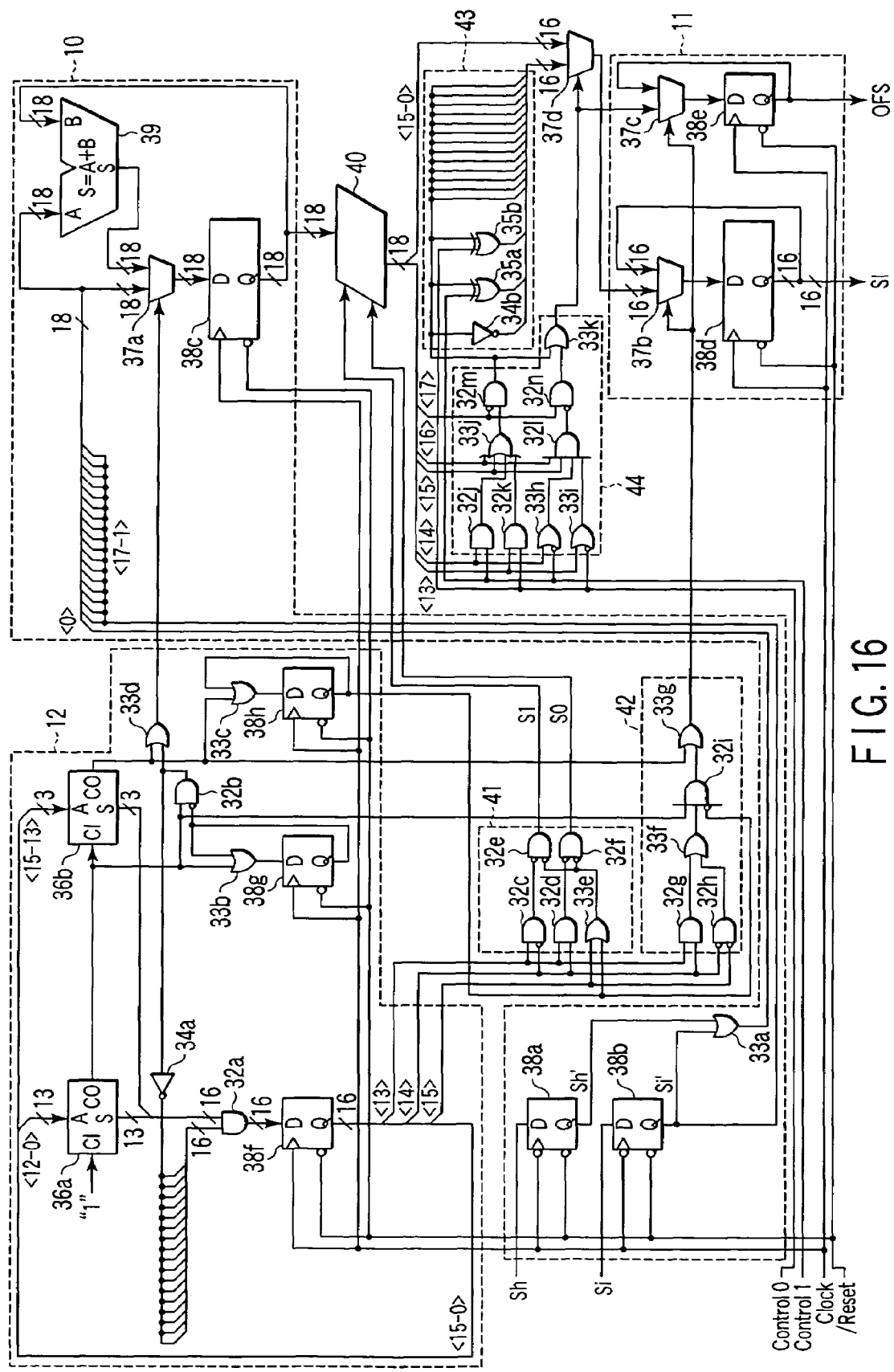
FIG. 16 is a circuit diagram of a frequency-offset detecting circuit 8a according to a fourth embodiment of the invention.

The fourth embodiment is identical to the first embodiment, except that it incorporates a frequency-offset generating circuit 8a shown in FIG. 16, in place of the frequency-offset generating circuit 8 of FIG. 7. The circuit 8a can be used in combination with the pulse-inserting circuit 9a illustrated in FIG. 12. In other words, the circuits 8a and 9a are configured to receive and output data of the same bit width, from and to each other.

As FIG. 16 shows, the frequency-offset generating circuit 8a comprises AND circuits 32a to 32n, OR circuits 33a to 33k, inverter circuits 34a and 34b, exclusive-OR circuits 35a and 35b, incrementers 36a and 36b, selectors 37a to 37d, registers 38a to 38h, an adder circuit 39, and a left shifter 40. In FIG. 16, the numbers assigned to each signal line represent the bit width of the signal supplied through the signal line, and "<0>" and "<17>" denote the first bit and eighteenth bit of 18-bit data, respectively.

The frequency-offset generating circuit 8a has an up-down counter 10, a register circuit 11, a timer circuit 12, a control-signal generating circuit 41, a writing control circuit 42, a limited-value generating circuit 43, and an overflow-detecting circuit 44.

The up-down counter 10 will be described. The counter 10 comprises an adder circuit 39, a selector 37a, registers 38a to 38c, and an OR circuit 33a. While the reset signal /Reset stays at low level, the registers 38a to 38c are initialized. That is, they holds "0" bits only (all bits held in them are at low level). The registers 38a and 38b receives a phase-advancing signal Sh and a phase-delaying signal Si, respectively.

While the reset signal /Rest remains at high level, the signals Sh and Si are held in the registers 38a and 38b, respectively, at the trailing edge (trailing edge is used to eliminate hazards in Sh and Si, leading edge is available if other hazard-avoiding way is employed) of the clock signal Clock. The registers 38a and 38b output signals Sh' and Si', which are supplied to the OR circuit 33a. The OR circuit 33a encode the signals Sh' and Si', generating 18-bit data that is expressed as a 2's complement. The OR circuit 33a performs the encoding as shown in Table 1 presented below.

TABLE 1

| Sh' | Si' | 18-bit data |
|-----|-----|-------------|
| 0 | 0 | 000000000000000000 (0) |
| 0 | 1 | 111111111111111111 (−1) |
| 1 | 0 | 000000000000000001 (+1) |
| 1 | 1 | Forbidden this inputs combination |

When the control signal input to the selector 37a, i.e., the output of OR circuit 33d, is at high level, the encoded data is input to the register 38c through the selector 37a. When the control signal input to the selector 37a is at low level, the output data of the adder circuit 39, i.e., the sum of the encoded data and the output data of the register 38c, is input to the register 38c through the selector 37a. The data is held in, and output from, the register 38c at the leading edge of the clock signal Clock.

As can be understood from Table 1, the data added input to the register 38c is "0," "1" or "−1." Circuit 10 defined by broken lines in FIG. 16 functions as an up-down counter. The up-down counter 10 has its count reset when the output of the OR circuit 33d is at high level. When the output of the OR circuit 33d is at low level, the up-down counter 10 operates as specified below in accordance with the values of the signals Sh' and Si':

It functions as an up counter when Sh'=1, Si'=0.
It functions as a down counter when Sh'=0, Si'=1.
It stops functioning when Sh'=Si'=0.

The register circuit 11 will be described. This circuit 11 comprises registers 38d and 38e and selectors 37b and 37c. While the reset signal /Reset remains at low level, the registers 38d and 38e are initialized. In other words, they holds "0" bits only (all bits held in them are at low level).

When the control signal input to the selectors 37b and 37c, i.e., the output of OR circuit 33g, is at high level, the latest frequency-offset data SI is input to the register 38d via the selector 37b. The output signal of the overflow-detecting circuit 44, i.e., the output data of OR circuit 33k, is input to the register 38e. Note that the output data of the OR circuit 33k rises to high level when the data that represents one cycle of the timer circuit 12 is output (namely, when the carry signal output from the incrementer 36b rises to high level).

When the data output from the OR circuit 33g is at low level, the outputs of the registers 38d and 38e are fed back to the registers 38d and 38e, respectively. While the reset signal /Reset remains at high level, the register 38d holds the data input to it at the leading edge of the clock signal Clock and outputs the frequency-offset data SI.

While the reset signal /Reset remains at high level, the register 38e holds the data input to it and outputs an overflow signal OFS at the leading edge of the clock signal Clock.

The timer circuit 12 will be described. The timer circuit 12 comprises incrementers 36a and 36b, registers 38f to 38h, OR circuits 33b to 33d, an inverter 34a, and AND circuits 32a and 32b.

The AND circuit 32a receives 16-bit data at its one input terminal. The 16-bit data consists of lower 13 bits output from the incrementer 36a and higher 3 bits output from the incrementer 36b.

The AND circuit 32a receives, at its other input terminal, the output data of the AND circuit 32b, which has been inverted by the inverter 34a. The output data of the AND circuit 32a is input to the register 38f. Of the output data of the register 38f, the lower 13 bits are input to the incrementer 36a, and the higher 3 bits are input to the incrementer 36b. A carry signal output from the incrementer 36a is input to the carry-input terminal CI of the incrementer 36b, one input terminal of the OR circuit 33b and the non-inverting input terminal of the AND circuit 32b.

The output data of the OR circuit 33b is input to the register 38g. The output data of the register 38g is input to the other input terminal of the OR circuit 33b and the inverting input terminal of the AND circuit 32b. The carry signal output from the incrementer 36b is input to one input terminal of the OR circuit 33c and to one input terminal of the OR circuit 33d. The other input terminal of the OR circuit 33d receives the output data of the register 38h. The output data of the AND circuit 32b is input to the inverter 34a and to the other input terminal of the OR circuit 33d.

How the timer circuit 12 operates will be explained. While the reset signal /Reset stays at low level, the registers 38f to 38h are initialized. In other words, they holds "0" bits only (all bits held in them are at low level). Thus, the output data of the OR circuit 33d, i.e., the output of the timer circuit 12, is at low level, and the carry signal output from the incrementer 36a is at low level, too. Hence, the output data of the AND circuit 32b is at low level, and the output data of the inverter 34a is at high level. The register 38f receives data via the AND circuit 32a. This data is the combined data of the two data items output from the incrementers 36a and 36b, respectively.

While the reset signal /Reset is at high level, the registers 38f to 38h hold the data items input to them, at the leading edge of the clock signal Clock. The incrementers 36a and 36b add "1" to the data items input to their input terminals A, when the carry signal CI is "1" (at high level), and output the resultant data items.

The data in the register 38f therefore increases by "1" every time the clock signal Clock rises to high level. When the data changes to "$(2^{13})$ −1 (i.e., "0001111111111111"), the carry signal output from the incrementer 36a rises to high level. The OR circuit 33b functions so that the register 38g may hold this carry signal until the reset signal /Reset falls to low level again.

At this time, the output data of the AND circuit 32b is at high level, and the output data of the inverter 43a is at low level. Thus, data "0000000000000000" is input from the AND circuit 32a to the register 38f. At the next leading edge of the clock signal Clock, the registers 38f and 38g holds the data items input to them. That is, the register 38f is set to the initial value again, and the register 38g holds "1" (data at high level).

Then, the data held in the register 38f increase by 1, at every leading edge of the clock signal Clock. Even if the data increases to $(2^{13})$ −1," the register 38f will not be initialized and the data it holds will keep increasing. This is because the output data of the register 38g, i.e., "1" (high level), is input to the inverting input terminal of the AND circuit 32b.

When the data in the register 38f becomes "$2^{16}$−1," or "1111111111111111," the carry signal output from the incrementer 36b rises to high level. The output of the timer circuit 12 (i.e., the data output from the OR circuit 33d) rises to high level. The 16-bit data "0000000000000000," i.e., the combined data of the output data items of the incrementers 36a and 36b, is input to the register 38f.

At the next leading edge of the clock signal Clock, the register 38f is initialized, with all bits held in it changed to "0." As a result, the data output from the OR circuit 33d falls to low level. The OR circuit 33c functions so that the register 38h may hold the carry signal output from the incrementer 36b until the reset signal /Reset falls to low level again. The data output from the register 38h represents whether the first one cycle of the timer circuit 12 has elapsed or not. As the clock signal Clock is further input to the register 38f, the data in this register 38f increases bit by bit.

The longer the cycle of the timer circuit 12, i.e., the time between two successive rising edges of the output of the OR circuit 33d, the higher the accuracy of the frequency-offset data SI output from the frequency-offset generating circuit 8a is. If the accuracy of the data SI is high, however, a longer time is required to generate the data SI. No effective frequency-offset data exists immediately after the frequency-offset generating circuit 8a starts generating when the reset signal /Reset rises from low level to high level. In other words, SI=0 when the circuit 8a starts performing its function.

In the frequency-offset generating circuit 8a, the left shifter 40 shifts the interim result of calculation. The output of the left shifter 40 is input to the register 38d, thereby providing effective frequency-offset data at the time the circuit 8a starts performing its function. The left shifter 40 operates in such a way as is shown in Table 2 presented below. Namely, the left shifter 40 shifts the input data to a greater value each time.

TABLE 2

| S1 | S0 | Operation of left shifter 40 |
|---|---|---|
| 0 | 0 | Doesn't Shift |
| 0 | 1 | Shift Left By 1 bit |
| 1 | 0 | Shift Left By 2 bits |
| 1 | 1 | Shift Left By 3 bits |

In the frequency-offset generating circuit 8a, the control-signal generating circuit 41 generates control signals S0 and S1. These signals S0 and S1 are supplied to the left shifter 40. As shown in FIG. 16, the control-signal generating circuit 41 comprises AND circuits 32c to 32f and an OR circuit 33e. The circuit 41 decodes the upper three bits of the data output from the register 38f, generating control signals S0 and S1. The circuit 41 receives the data output from the register 38h. Once the data output from the register 38h has risen to high level, the circuit 41 no longer allows the left shifter 40 to operate. This is because effective frequency-offset data SI is generated since the one cycle of the timer circuit 12 has elapsed.

The writing control circuit 42 controls the time at which to write the frequency-offset data SI to the register circuit 11. The writing control circuit 42 and the control-signal generating circuit 41 cooperate, generating frequency-offset data at such timing and to such accuracy as shown in Table 3. In Table 3, "N" denotes a positive integer number. The larger the bit width of the frequency-offset data, the more accurate the data is.

TABLE 3

| Clock Cycle | Data in register 38f | Shift Bits | Accuracy |
|---|---|---|---|
| 8192 | 0010000000000000 | 3 bit | 13 bit |
| 16384 | 0010000000000000 | 3 bit | 13 bit |
| 24576 | 0100000000000000 | 2 bit | 14 bit |
| 40960 | 1000000000000000 | 1 bit | 15 bit |
| 73728 | 0000000000000000 | 0 bit | 16 bit |
| ... | ... | ... | ... |
| $N \times 2^{16} + 2^{13}$ | 0000000000000000 | 0 bit | 16 bit |

The writing control circuit 42 detects that the data in the register 38f becomes the data shown in Table 3, and generates the data representing this fact. The data thus generated is supplied to the control terminals of the selectors 37b and 37c. Upon receipt of the data, the selectors 37b and 37c output the data input to at their left input terminals.

Assume that the register 38f holds "0100000000000000." Then, the left shifter 40 shifts the output data of the up-down counter 10, left by two bits, as is shown in Table 3. This enables to the frequency-offset generating circuit 8a to generate 16-bit frequency-offset data SI even if only 14 bits of frequency-offset information have been generated.

"Clock cycle" in Table 3 denotes the number of leading edges of the clock signal Clock (i.e., the number of pulses). If the intervals between the leading edges are constant, the clock cycle will be proportional to the time the timer circuit 12 has measured. As seen from Table 3, the frequency-offset data has the same accuracy when the clock cycle is 8192 and when the clock cycle is 16384. This is because the register 38f is cleared to "0" in the clock cycle next to the clock cycle in which the data in the register 38f once reached "$(2^{13})-1$."

The register 38f is so cleared in order to eliminate the influence of initial drift of the clock data recovery (CDR) circuit. Since the CDR is performed by a feedback control system, some time elapses until the operation of the feedback control system becomes stable. This means that any frequency-offset data SI generated immediately after the system starts operating contains many errors. This is why the frequency-offset data obtained immediately after the reset signal /Reset rises to high level is discarded, and new frequency-offset data is generated.

Thus, frequency-offset data SI not so accurate but having less error can be obtained within a short time from the start of operation of the feedback control system. Without this shift operation explained above, 16-bit data SI cannot be obtained until the timer cycle of 65536 pulses ($=2^{16}$ pulses) expires after the reset signal /Reset rises to high level. Even if this (65536) timer cycle includes a consecutive identical digit (CID) period, the clock-recovering filter circuit 5 cannot perform its function. That is, the time that elapses until the clock-recovering filter circuit 5 operates reduced to one-eighth (⅛) with the shifting operation by the left-shifter 40.

The frequency-offset detecting circuit 8a has, among other components, the limited-value generating circuit 43 and the overflow-detecting circuit 44. As FIG. 16 shows, the limited-value generating circuit 43 comprises the exclusive-OR circuits 35a and 35b and the inverter circuit 34b, and the overflow-detecting circuit 44 comprises AND circuits 32j to 32n and OR circuits 33h to 33k.

The overflow-detecting circuit 44 determines whether an overflow takes place or not at the output of the left-shifter 40. Upon detecting an overflow, the circuit 44 outputs high-level data. The high-level data is supplied to the control input terminal of the selector 37d and to the input terminal of the selector 37c. The selector 37d selects limited data, which will be described later.

The overflow signal OFS shows that the limited-value generated by circuit 43 has stored in the register 38d because the data output from the left shifter 40 has fallen outside the range defined by signals Control 0 and Control 1. Note that the overflow signal OFS, that the register 38e has, is a signal generated from the signal output from the overflow-detecting circuit 44.

The overflow signal OFS is output to, for example, an external circuit outside the clock recovery circuit 1. Upon receiving the overflow signal OFS, the external circuit detects that an overflow takes place in the clock recovery circuit 1. Since the time the timer circuit 12 measures is constant, the up-down counter 10 is prevented from overflowing only if its bit width is appropriate.

The limited-value generating circuit 43 generates limited data. The limited data has its constant value controlled by the control signals Control 0 and Control 1. Table 4 set forth below shows the relation between the limited range of SI and the signals Control0 and Control1. In Table 4, the limited range of SI is defined by the minimum and maximum values that the frequency-offset data SI can have.

TABLE 4

| Control 1 | Control 0 | Limited range of S1 |
|---|---|---|
| 0 | 0 | $-2^{15}$ to $2^{15} - 1$ |
| 0 | 1 | Forbidden this inputs combination |
| 1 | 0 | $-2^{14}$ to $2^{14} - 1$ |
| 1 | 1 | $-2^{13}$ to $2^{13} - 1$ |

As seen from Table 4, the frequency-offset data SI can have various limited range. Which limited range the data SI should have depends on the specification of the CDR circuit.

The limited-value generating circuit 43 is used for the following reason. The phase of the input data Sa may abruptly change, as in the case of the initial drift mentioned above. If the input data Sa so changes, the phase-advancing signal Se or phase-delaying signal Sf will rise to high level in many cases, in order to follow the abrupt change of the input data Sa. If the frequency-offset data Sl is generated while the signal Sa is changing in phase, its absolute value will be greater than the absolute value of the real frequency difference. In view of this, the frequency-offset data SI calculated is limited if its magnitude is too great. The phase error occurring during the CID period is thereby limited.

Figure 17:
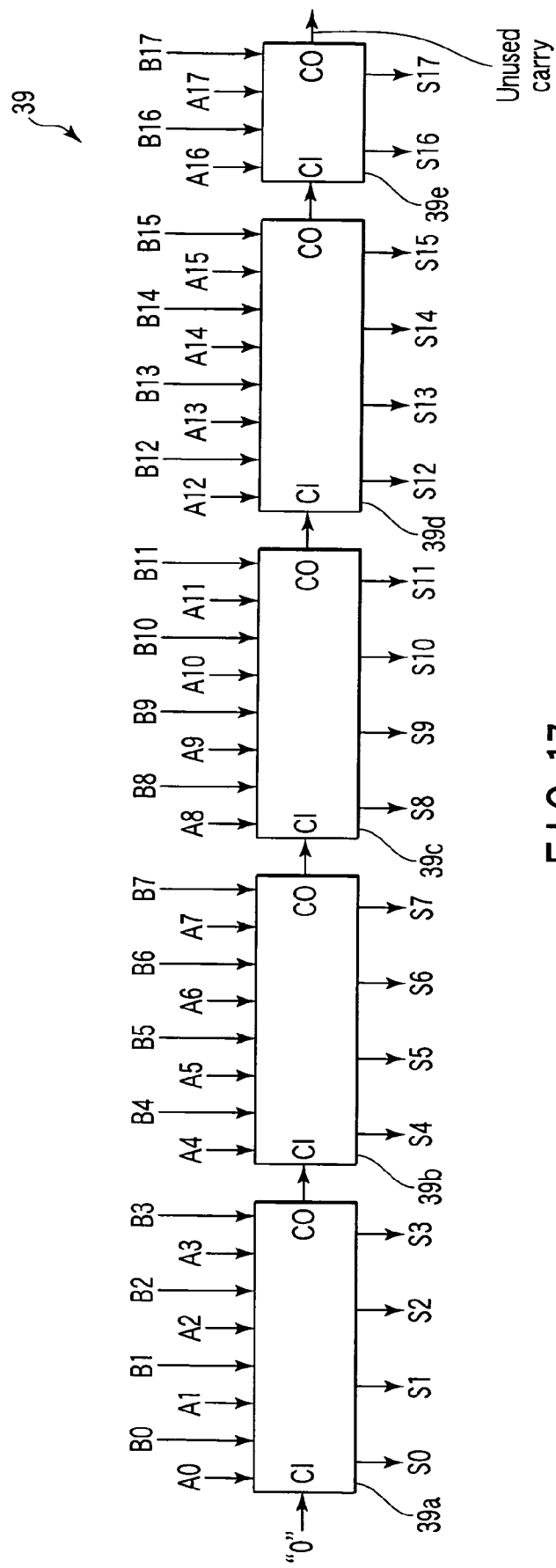
FIG. 17 is a block diagram of the adder circuit 39 used in the frequency-offset detecting circuit 8a shown in FIG. 16.

FIG. 17 is a block diagram of the adder circuit 39 used in the frequency-offset generating circuit 8a shown in FIG. 16. The adder circuit 39 comprises 4-bit adders 39a to 39d and a 2-bit adder 39e. The 4-bit adders 39a to 39d have the same configuration as the 4-bit adder 14a illustrated in FIG. 14.

The adder circuit 39 adds the 18-bit data A<17-0> and 18-bit data B<17-0>, generating the sum S<17-0>. Each of 4-bit adders has its carry-output terminal connected to the carry-input terminal of the adder at the next stage. Data "0" is input to the carry-input terminal CI of the first-stage 4-bit adder 39a.

The carry output from the 2-bit adder 39e, i.e., the last-stage adder, is not used at all. Therefore, the carry-output terminal CO of the 2-bit adder 39e is connected to nothing. Thus constructed, adder circuit 39 can operate faster than a carry-ripple adder constructed by full adders only.

Figure 18:
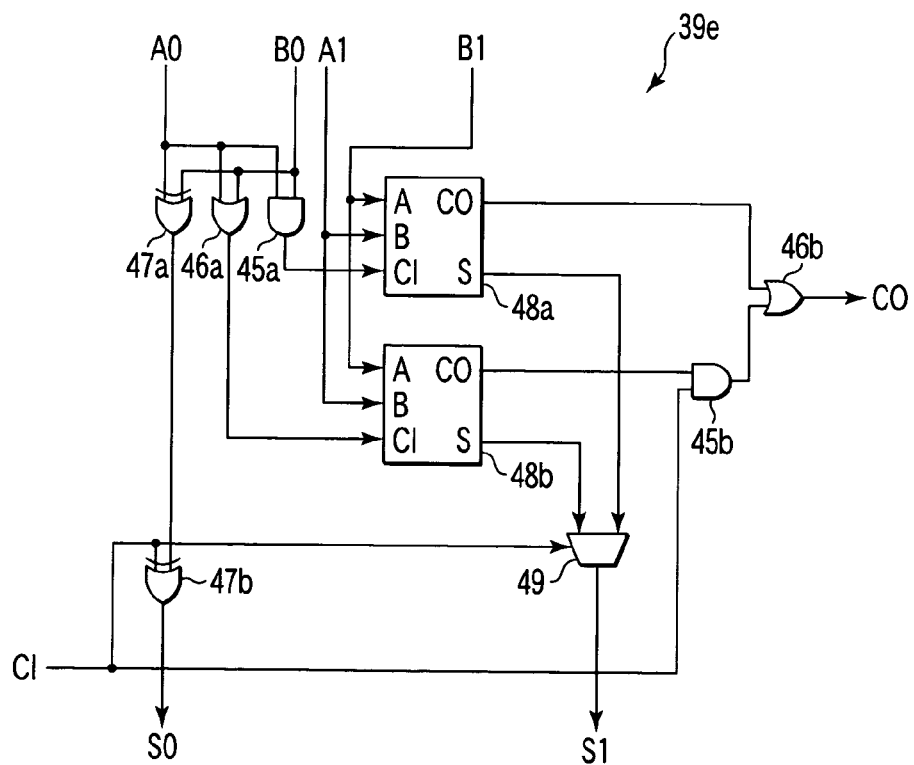
FIG. 18 is a circuit diagram of the 2-bit adder 39e used in the adder circuit 39 shown in FIG. 17.

FIG. 18 is a circuit diagram of the 2-bit adder 39e used in the adder circuit 39 shown in FIG. 17. As FIG. 18 depicts, the 2-bit adder 39e comprises AND circuits 45a and 45b, OR circuits 46a and 46b, exclusive-OR circuits 47a and 47b, full adders 48a and 48b, and a selector 49. The full adders 48a and 48b have the same configuration as the full adder 14e shown in FIG. 15.

The 2-bit adder 39e adds 2-bit data A<1-0> and 2-bit data B<1-0>, with an input carry signal CI. Thus, the adder 39e generates the sum S<1-0> and an output carry signal CO.

Figure 19:
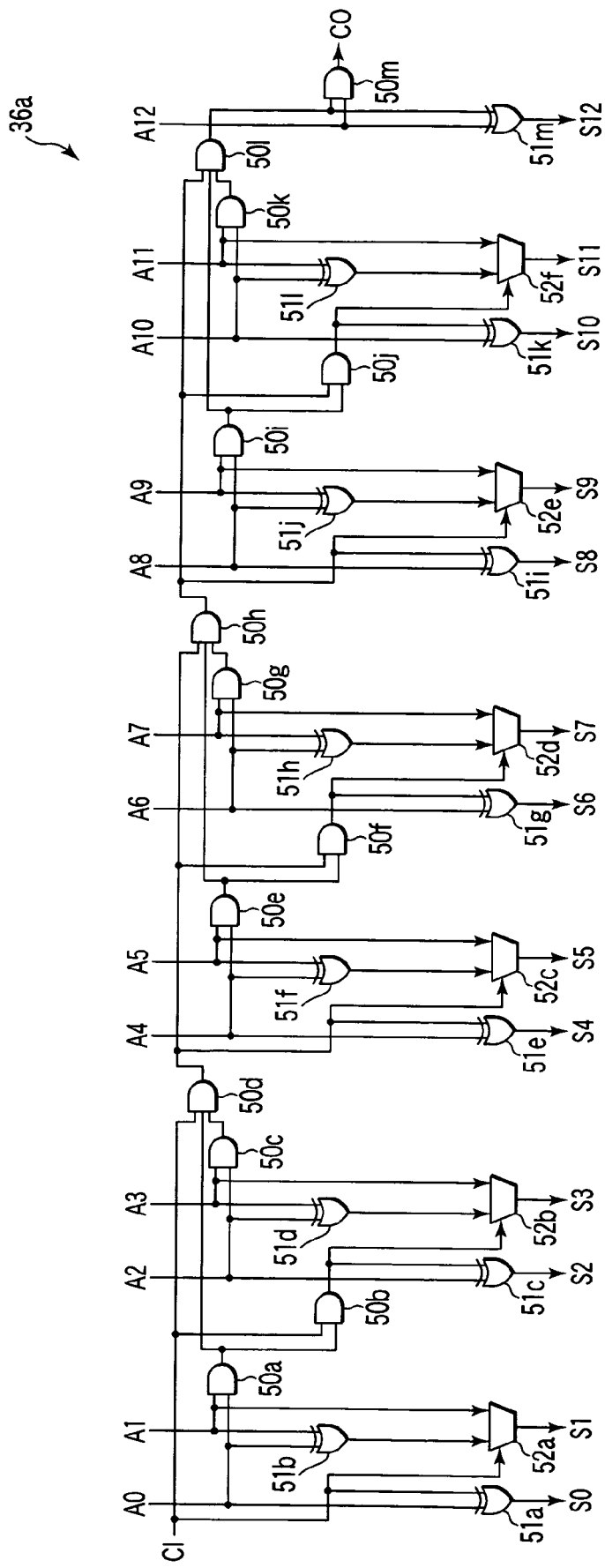
FIG. 19 is a circuit diagram of the incrementer 36a used in the frequency-offset detecting circuit 8a shown in FIG. 16.

FIG. 19 is a circuit diagram of the incrementer 36a used in the frequency-offset generating circuit 8a shown in FIG. 16. As FIG. 19 shows, the incrementer 36a comprises exclusive-OR circuits 51a to 51m, selectors 52a to 52f, and AND circuits 50a to 50m. Data A<12-0> is input to the incrementer 36a. The incrementer 36a outputs data S<12-0>. An input carry signal CI is input to the incrementer 36a, and an output carry signal CO is output from the incrementer 36a. The incrementer 36a adds the carry signal CI to data A<12-0>, generating data S<12-0>. The carry signal generated from the most significant bit is output as output signal CO.

Figure 20:
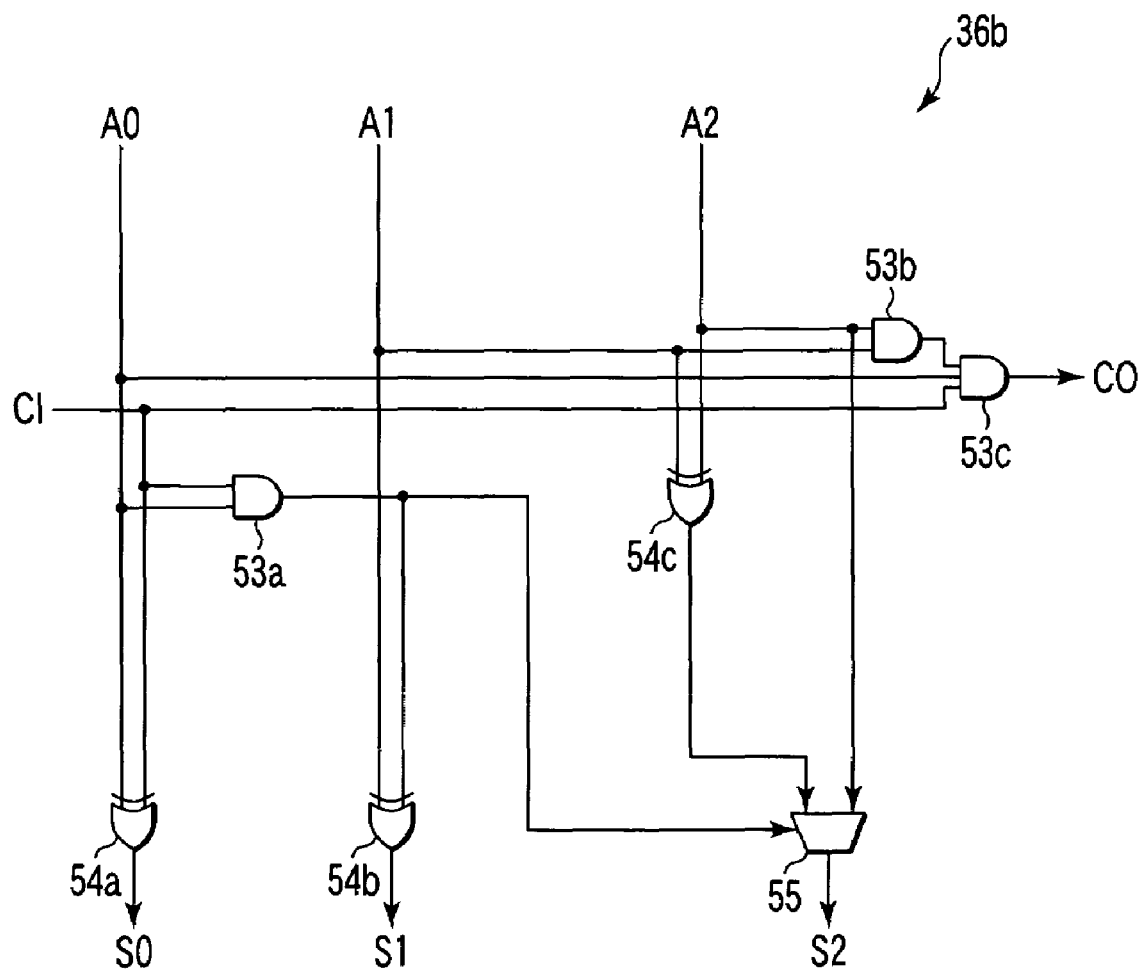
FIG. 20 is a circuit diagram of the incrementer 36b used in the frequency-offset detecting circuit 8a shown in FIG. 16.

FIG. 20 is a circuit diagram of the incrementer 36b used in the frequency-offset generating circuit 8a shown in FIG. 16. As is shown in FIG. 20, the incrementer 36b comprises exclusive-OR circuits 54a to 54c, a selector 55, and AND circuits 53a to 53c. Data A<2-0> is input to the incrementer 36b. The incrementer 36b outputs data S<2-1>. An input carry signal CI is input to the incrementer 36b. An output carry signal CO is output from the incrementer 36b. The incrementer 36b adds the carry signal CI to the data A<2-0>, generating data S<2-0>. The carry signal generated from the most significant bit is output as output signal CO.

Figure 21:
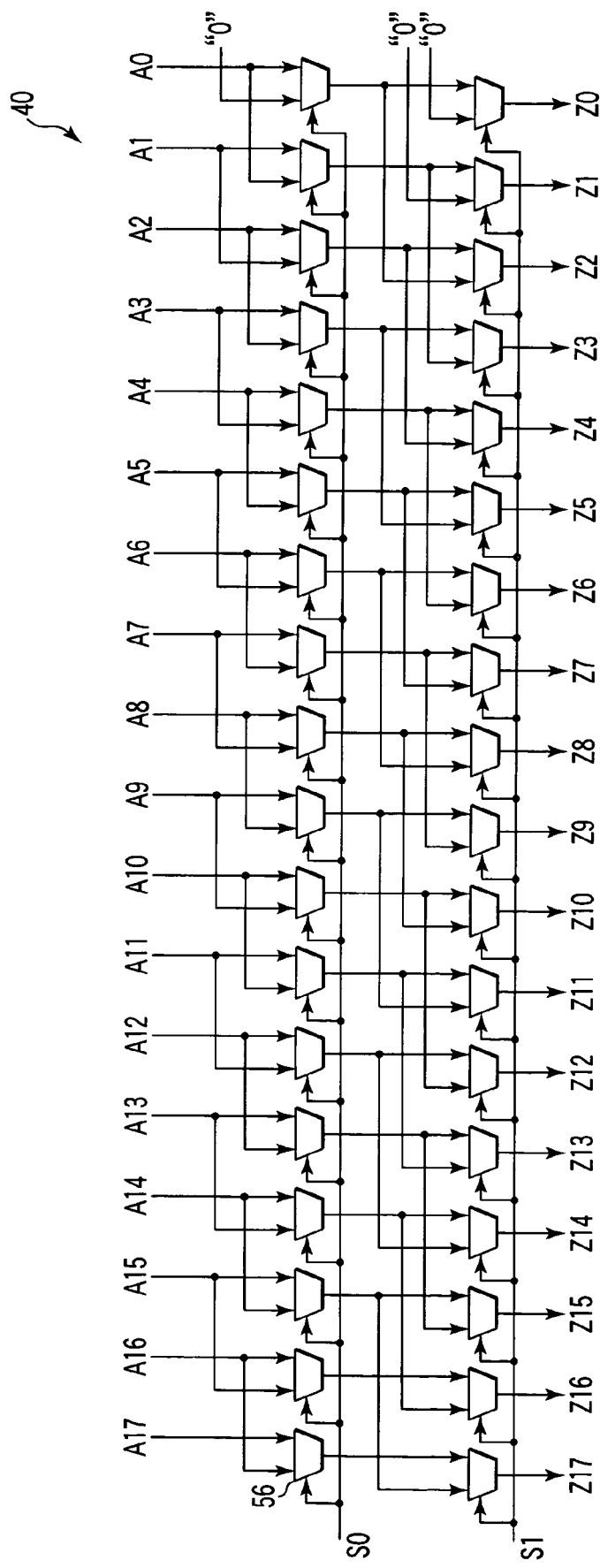
FIG. 21 is a circuit diagram of the left shifter 40 used in the frequency-offset detecting circuit 8a shown in FIG. 16.

FIG. 21 is a circuit diagram of the left shifter 40 used in the frequency-offset generating circuit 8a shown in FIG. 16. As FIG. 21 depicts, the left shifter 40 comprises selectors 56. Data A<17-0> is input to the left shifter 40. The left shifter 40 outputs data Z<17-0>. A control signal S<1-0> is supplied to the left shifter 40. The left shifter 40 operates as is illustrated in Table 2.

FIG. 22 is a diagram representing the operation of the clock recovery circuit 1 that incorporates the pulse-inserting circuit 9a and the frequency-offset generating circuit 8a. More precisely, FIG. 22 shows how the phase is followed in the clock recovery circuit 1 when the frequency difference is 61 ppm. In FIG. 22, the phase is plotted on y axis, and sampling points are plotted on x axis. The graph of FIG. 22 shows the case where the phase plotting is turned back at the phase of 180° ($\pi$ radian). FIG. 22 shows the phase of the clock signal (not having jitter) that is contained in the input data Sa, and the phase of the recovery clock signal Sk in the circuit 1.

As can be understood from FIG. 22, the recovery clock signal Sk follows the phase of the input data Sa, with a little error, during the CID period. As seen from FIG. 22, too, the recovery clock Sk has no jitter in CID period even if the frequency-offset data Sl has been generated from the input data Sa that has jitter. That is, the jitter has been filtered out in the clock recovery circuit 1 in CID period.

As has been described in detail, the fourth embodiment can achieve the same advantages as the first embodiment.

The frequency-offset generating circuit 8a has a limiting circuit (limited-value generating circuit 43 and overflow-detecting circuit 44). Thus, the clock-recovering filter circuit 5 would not malfunction due to the erroneous frequency-offset data SI, during the initial drift of the circuit 1 or at an abrupt change in the phase of the input data Sa.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A clock-recovering filter circuit for use in a clock recovery circuit that generates a recovery clock signal from input data from an external device and a reference clock signal, the filter circuit comprising:
    a first input terminal which receives a first phase-advancing signal for advancing the phase of the recovery clock signal when the recovery clock signal is delayed with respect to the input data;
    a second input terminal which receives a first phase-delaying signal for delaying the phase of the recovery clock signal when the recovery clock signal is advancing with respect to the input data;
    a pulse-inserting circuit which inserts pulses in the first phase-advancing signal or the first phase-delaying signal, thereby generating a second phase-advancing signal or a second phase-delaying signal; and
    a frequency-offset detecting circuit which detects frequency-offset data from the second phase-advancing signal and the second phase-delaying signal, the frequency-offset data representing a frequency difference between the recovery clock signal and the reference clock signal,
    wherein the pulse-inserting circuit inserts the pulses in accordance with the frequency-offset data when the first phase-advancing signal or the first phase-delaying signal is not input.

2. The clock-recovering filter circuit according to claim 1, wherein the frequency-offset data includes a frequency-offset data item representing a frequency difference between the recovery clock signal and the reference clock signal and a polarity data item indicating whether the frequency of the recovery clock signal is higher or lower than the frequency of the reference clock signal; and the pulse-inserting circuit inserts the pulses in the first phase-advancing signal or the first phase-delaying signal in accordance with the polarity data item.

3. The clock-recovering filter circuit according to claim 2, wherein the pulse-inserting circuit determines, from the frequency-offset data, a pulse-inserting period required to compensate the frequency difference between the recovery clock signal and the reference clock signal, and inserts the pulses when the first phase-advancing signal or the first phase-delaying signal is not input within the pulse-inserting period.

4. The clock-recovering filter circuit according to claim 3, wherein the frequency-offset detecting circuit detects the frequency-offset data at predetermined intervals.

5. The clock-recovering filter circuit according to claim 4, wherein the pulse-inserting circuit includes an adder circuit which accumulates the frequency-offset data, thereby generating sum data, and a first detection circuit which detects whether the sum data exceeds a threshold value, and determines the pulse-inserting period when the sum data exceeds the threshold value.

6. The clock-recovering filter circuit according to claim 5, wherein the pulse-inserting circuit includes a reset circuit which resets the sum data when the first phase-advancing signal or the first phase-delaying signal is input.

7. The clock-recovering filter circuit according to claim 6, wherein the pulse-inserting circuit includes an excessive data generating circuit which generates excessive data representing an excessive part of the sum data, by which the sum data is greater than the threshold value, and determines, from the excessive data, the pulse-inserting period during which a second pulse next to a first pulse should be inserted.

8. The clock-recovering filter circuit according to claim 7, wherein the adder circuit adds the frequency-offset data to the excessive data used as an initial value when the first pulse is inserted.

9. The clock-recovering filter circuit according to claim 4, wherein the frequency-offset detecting circuit includes a timer circuit which measures time and which generates a first signal at the predetermined intervals.

10. The clock-recovering filter circuit according to claim 9, wherein the frequency-offset detecting circuit includes a counter circuit whose count increases when the second phase-advancing signal is input, decreases when the second phase-delaying signal is input and is reset when the first signal is input.

11. The clock-recovering filter circuit according to claim 10, wherein the frequency-offset detecting circuit includes a first holding circuit which holds the count of the counter circuit upon receipt of the first signal and which outputs the count as the frequency-offset data.

12. The clock-recovering filter circuit according to claim 11, wherein the frequency-offset detecting circuit includes a second detection circuit which detects whether the frequency-offset data falls outside a predetermined range, a limited-value generating circuit which generates limited data, and a control circuit which inputs the limited data to the first holding circuit, in place of the count of the counter circuit, when the frequency-offset data falls outside the predetermined range.

13. The clock-recovering filter circuit according to claim 1, further comprising a selecting circuit and a second holding circuit which holds data selected by the selecting circuit and supplies the data as frequency-offset data to the pulse-inserting circuit, wherein the selecting circuit selects the frequency-offset output from the frequency-offset detecting circuit, when the first phase-advancing signal or the first phase-delaying signal is input, and selects the frequency-offset data output from the second holding circuit, when the first phase-advancing signal or the first phase-delaying signal is not input.

* * * * *